United States Patent
Kaeriyama

(10) Patent No.: US 8,710,964 B2
(45) Date of Patent: Apr. 29, 2014

(54) RECEPTION CIRCUIT AND SIGNAL RECEPTION METHOD

(75) Inventor: Shunichi Kaeriyama, Tokyo (JP)

(73) Assignee: NEC Corporation, Tokyo (JP)

(*) Notice: Subject to any disclaimer, the term of this patent is extended or adjusted under 35 U.S.C. 154(b) by 262 days.

(21) Appl. No.: 13/147,667

(22) PCT Filed: Jan. 27, 2010

(86) PCT No.: PCT/JP2010/000465
§ 371 (c)(1),
(2), (4) Date: Aug. 3, 2011

(87) PCT Pub. No.: WO2010/095368
PCT Pub. Date: Aug. 26, 2010

(65) Prior Publication Data
US 2011/0291819 A1  Dec. 1, 2011

(30) Foreign Application Priority Data
Feb. 20, 2009 (JP) ................... 2009-038070

(51) Int. Cl.
*G09F 25/00* (2006.01)
*H04M 11/04* (2006.01)
*G08B 1/08* (2006.01)

(52) U.S. Cl.
USPC ............ 340/286.01; 340/538.12; 340/538.16; 340/12.34; 340/12.38; 333/24 R; 375/259

(58) Field of Classification Search
USPC .......................... 340/286.01, 538.12, 538.16
See application file for complete search history.

(56) References Cited

U.S. PATENT DOCUMENTS

| | | | |
|---|---|---|---|
| 4,697,166 A * | 9/1987 | Warnagiris et al. | 375/258 |
| 6,262,600 B1 | 7/2001 | Haigh et al. | |
| 6,525,566 B2 | 2/2003 | Haigh et al. | |
| 6,873,065 B2 | 3/2005 | Haigh et al. | |
| 6,903,578 B2 | 6/2005 | Haigh et al. | |
| 6,922,080 B2 | 7/2005 | Haigh et al. | |
| 7,075,329 B2 | 7/2006 | Chen et al. | |
| 7,302,247 B2 | 11/2007 | Dupuis | |
| 2004/0160289 A1 * | 8/2004 | Shigeno | 333/24 R |
| 2012/0020419 A1 * | 1/2012 | Kaeriyama | 375/259 |

FOREIGN PATENT DOCUMENTS

| | | |
|---|---|---|
| JP | 63-12600 A | 4/1988 |
| JP | 8-236696 A | 9/1996 |
| JP | 9-331277 A | 12/1997 |
| JP | 2005073209 A | 3/2005 |
| JP | 2007324787 A | 12/2007 |
| WO | 2006013638 A | 2/2006 |

OTHER PUBLICATIONS

International Search Report for PCT/JP2010/000465 mailed Apr. 27, 2010.

* cited by examiner

*Primary Examiner* — Donnie Crosland
(74) *Attorney, Agent, or Firm* — Sughrue Mion, PLLC

(57) ABSTRACT

A reception circuit according to the present invention is a reception circuit (6) that operates based on a first power supply GND1 belonging to a first power supply system and receives, through an AC coupling element (10), a transmission signal V1 output by a transmission circuit (5) that operates based on a second power supply GND2 belonging to a second power supply system, the reception circuit including: a noise rejection unit (21) that generates a transmission-use signal V2a by reducing a signal level of noise between the power supplies generated in the AC coupling element (10) due to a potential difference between the first power supply GND1 and the second power supply GND2; and a reception buffer (22) that reproduces a data signal based on the transmission-use signal. This prevents a malfunction from occurring due to noise between the power supplies caused by a relative potential variation between the power supply of the transmission circuit and the power supply of the reception circuit.

29 Claims, 36 Drawing Sheets

US 8,710,964 B2

RECEPTION CIRCUIT AND SIGNAL RECEPTION METHOD

TECHNICAL FIELD

The present invention relates a reception circuit and a signal reception method, and more particularly, to a reception circuit and a signal reception method for receiving a signal through an AC coupling element.

BACKGROUND ART

When signals are transmitted among a plurality of semiconductor chips having different power supply voltages, direct transmission of signals through lines causes a difference in DC voltage, which may result in damage to the semiconductor chips and failure of signal transmission. Accordingly, when signals are transmitted among a plurality of semiconductor chips having different power supply voltages, the semiconductor chips are connected with an AC coupling element to transmit only AC signals. Examples of the AC coupling element include a capacitor and a transformer. Here, the transformer refers to an AC coupling element including a primary coil and a secondary coil which are magnetically coupled together. When the transformer is used as the AC coupling element, a turn ratio between the primary coil and the secondary coil of the transformer is adjusted. This allows transfer of signals with an appropriate voltage amplitude to the semiconductor chip on the reception side, regardless of the voltage amplitude of a transmission signal from the semiconductor chip on the transmission side. Thus, the use of the transformer in communication between the semiconductor chips, which operate at different power supply voltages, eliminates the need to adjust the voltage amplitude of the transmission signal or reception signal on the semiconductor chips. Hereinafter, the transformer formed on a semiconductor chip is referred to as an on-chip transformer, as needed.

Examples of a signal transmission technique using transformers are disclosed in Patent Literatures 1 to 8. In the signal transmission methods disclosed in Patent Literatures 1 to 5, two transformers are used for signal transmission. When a data value transits from a first value to a second value, a pulse signal is sent to a first transformer, and when the data value transits from the second value to the first value, a pulse signal is sent to a second transformer.

In the signal transmission methods disclosed in Patent Literatures 1, 2, and 4 to 6, consecutive pulse signals are sent to transformers during a period in which data has the first value, and the signal levels of the signals to be sent to the transformers are fixed during a period in which the data has the second value.

In the signal transmission methods disclosed in Patent Literatures 1, 2, 4, and 5, consecutive pulse signals each having a first frequency are sent to transformers during the period in which the data has the first value, and consecutive pulse signals each having a second frequency are continuously sent to the transformers during the period in which the data has the second value. Further, in the signal transmission methods disclosed in Patent Literatures 1, 2, 4, and 5, two transformers are used. During the period in which the data has the first value, the same signal is sent to the two transformers, and during the period in which the data has the second value, signals having inverted phases are sent to the respective transformers.

In the signal transmission method disclosed in Patent Literature 7, when the data value transits from the first value to the second value, a signal having one pulse is sent to each transformer, and when the data value transits from the second value to the first value, a signal having two consecutive pulses is sent to each transformer.

In the signal transmission method disclosed in Patent Literature 8, when the data value transits from the first value to the second value, a pulse signal having a first amplitude is sent to each transformer, and when the data value transits from the second value to the first value, a pulse signal having a second amplitude is sent to each transformer.

CITATION LIST

Patent Literature

[Patent Literature 1] U.S. Pat. No. 6,262,600
[Patent Literature 2] U.S. Pat. No. 6,525,566
[Patent Literature 3] U.S. Pat. No. 6,873,065
[Patent Literature 4] U.S. Pat. No. 6,903,578
[Patent Literature 5] U.S. Pat. No. 6,922,080
[Patent Literature 6] U.S. Pat. No. 7,302,247
[Patent Literature 7] U.S. Pat. No. 7,075,329
[Patent Literature 8] Japanese Unexamined Patent Application Publication No. 08-236696

SUMMARY OF INVENTION

Technical Problem

When a first power supply (for example, a first ground voltage) on a reception circuit side and a second power supply (for example, a second ground voltage) on a transmission circuit side are independent from each other, however, noise between power supplies occurs in an AC coupling element based on a relative potential difference between the first ground voltage and the second ground voltage. More specifically, when a transformer (especially, an on-chip transformer) and a capacitor are used as AC coupling elements, the noise between power supplies occurs due to a relative variation in voltage applied to both ends of a parasitic capacitor of the transformer or of the capacitor. Such a problem will be described with reference to an exemplary circuit.

A circuit example 100 shown in FIG. 40 includes a transceiver 101, a receiver 104, a set/reset latch circuit 107, and two transformers. The transceiver 101 includes transmission buffers 102 and 103. The receiver 104 includes reception buffers 105 and 106. A primary coil L11 and a secondary coil L12 constitute one of the transformers, and a primary coil L21 and a secondary coil L22 constitute the other of the transformers. In the transformers, parasitic capacitors Cp are formed between the primary coil L11 and the secondary coil L12 and between the primary coil L21 and the secondary coil L22. Each of the parasitic capacitors Cp is a capacitor having a configuration in which a dielectric filled between the primary coil and the secondary coil is used as a dielectric film and metal lines constituting the coils serve as electrodes.

In the circuit example 100, when data Vin is at a high level, the transmission buffer 102 transmits the data to the reception buffer 105 through one of the transformers, and when the data Vin is at a low level, the transmission buffer 103 transmits the data to the reception buffer 106 through the other of the transformers. At this time, the transmission buffers 102 and 103 each generate a pulse signal in a data transmission period.

FIG. 41 is a timing diagram showing operation of this circuit example 100. As shown in FIG. 41, during a period in which the data Vin is at the high level, a pulse signal is superimposed on a first transmission signal V11 output by the transmission buffer 102, and during a period in which the data Vin is at the low level, a pulse signal is superimposed on a second transmission signal V21 output by the transmission buffer 103. In this case, when a relative potential difference as shown in GND1-GND-2 of FIG. 41 exists between a first ground voltage GND1 and a second ground voltage GND2, a potential difference between a first reception signal V12 received by the reception buffer 105 and the second ground voltage GND2, and a potential difference between a second reception signal V22 received by the reception buffer 106 and the second ground voltage GND2 have waveforms represented by V21-GND2 and V22-GND2, respectively. That is, a variation of a relative potential difference between the first ground voltage GND1 and the second ground voltage GND2 is superimposed on each of the first reception signal V12 and the second reception signal V22.

At this time, when the variation of the relative potential difference between the first ground voltage GND1 and the second ground voltage GND2 is large, the signal level of the first reception signal V12 exceeds a threshold voltage Vth (105) (threshold voltage at which the reception buffer 105 inverts an output value) of the reception buffer 105 even during a period in which the transmission buffer 102 is not transmitting any pulse signal as the first transmission signal V11. This causes a defect in the waveform of a transmission-use signal V12a which is output by the reception buffer 105. Also in the reception buffer 106, the signal level of the second reception signal V22 is not sufficiently lowered and exceeds a threshold voltage Vth (106) (threshold voltage at which the reception buffer 106 inverts an output value) for a long period of time even during a period in which the transmission buffer 103 is transmitting a pulse signal as the first transmission signal V21. This causes a defect in the waveform of a transmission-use signal V22a which is output by the reception buffer 106. When the set/reset latch circuit 107 operates based on the transmission-use signals V12a and V22a, there occurs such a failure that the output value is indeterminate during the period indicated by "Unstable" in FIG. 41, for example.

Thus, when signals are transmitted between different power supply systems using the AC coupling element having a capacitive coupling path (a path passing through the parasitic capacitor Cp as described above), a relative potential difference between one power supply system and the other power supply system varies, thereby causing a signal transmission error. In the techniques described in Patent Literatures 1 to 8, there is disclosed no countermeasure for a failure due to such a variation of the relative potential difference between the power supply systems.

In view of the problems described above, the present invention aims to prevent a signal transmission error even when a variation of a relative potential difference in power supply voltage or ground voltage occurs between different power supply systems.

Solution to Problem

One aspect of the present invention is a reception circuit that operates based on a first power supply belonging to a first power supply system and receives, through an AC coupling element, a transmission signal output by a transmission circuit that operates based on a second power supply belonging to a second power supply system, the reception circuit including: a noise rejection unit that generates a transmission-use signal by reducing a signal level of noise between the power supplies, the noise being generated in the AC coupling element due to a potential difference between the first power supply and the second power supply; and a reception buffer that reproduces a data signal based on the transmission-use signal.

Another aspect of the present invention is a signal reception method for a reception circuit that operates based on a first power supply belonging to a first power supply system and receives, through an AC coupling element, a transmission signal output by a transmission circuit that operates based on a second power supply belonging to a second power supply system, the signal reception method including: generating a transmission-use signal by reducing a signal level of noise between the power supplies, the noise being generated in the AC coupling element due to a potential difference between the first power supply and the second power supply; and reproducing a data signal, based on the transmission-use signal.

Advantageous Effects of Invention

According to a reception circuit and a signal reception method according to the present invention, it is possible to prevent a signal transmission error even when a variation of a relative potential difference in power supply voltage or ground voltage occurs between different power supply systems.

DESCRIPTION OF EMBODIMENTS

First Exemplary Embodiment

A reception circuit according to the present invention receives a transmission signal transmitted from a transmission circuit, and has various modes depending on the transmission method of the transmission circuit. In addition, the reception circuit according to the present invention operates in a power supply system different from that for the transmission circuit, and has a function of reducing noise between power supplies which occurs due to a relative variation of a power supply potential between different power supplies. A method for reducing the noise between power supplies will be described below with reference to a plurality of exemplary embodiments. Hereinafter, a signal transmission system partially including the reception circuit according to the present invention will be described to fully explain the operation of the reception circuit according to the present invention.

Hereinafter, exemplary embodiments of the present invention will be described with reference to the drawings. First, a method for mounting a signal transmission system according to this exemplary embodiment will be described. In the signal transmission system according to this exemplary embodiment, transformers are constituted using two coils formed on one or two semiconductor chips. In other words, the two coils function as AC coupling elements (for example, transformers) magnetically coupled together. A primary coil is connected to a transmitting node of a transmission circuit formed on the semiconductor chip, and a secondary coil is connected to a receiving node of a reception circuit. FIGS. 1 to 10 show schematic views each illustrating a mounted state of the signal transmission system according to this exemplary embodiment.

Figure 1:
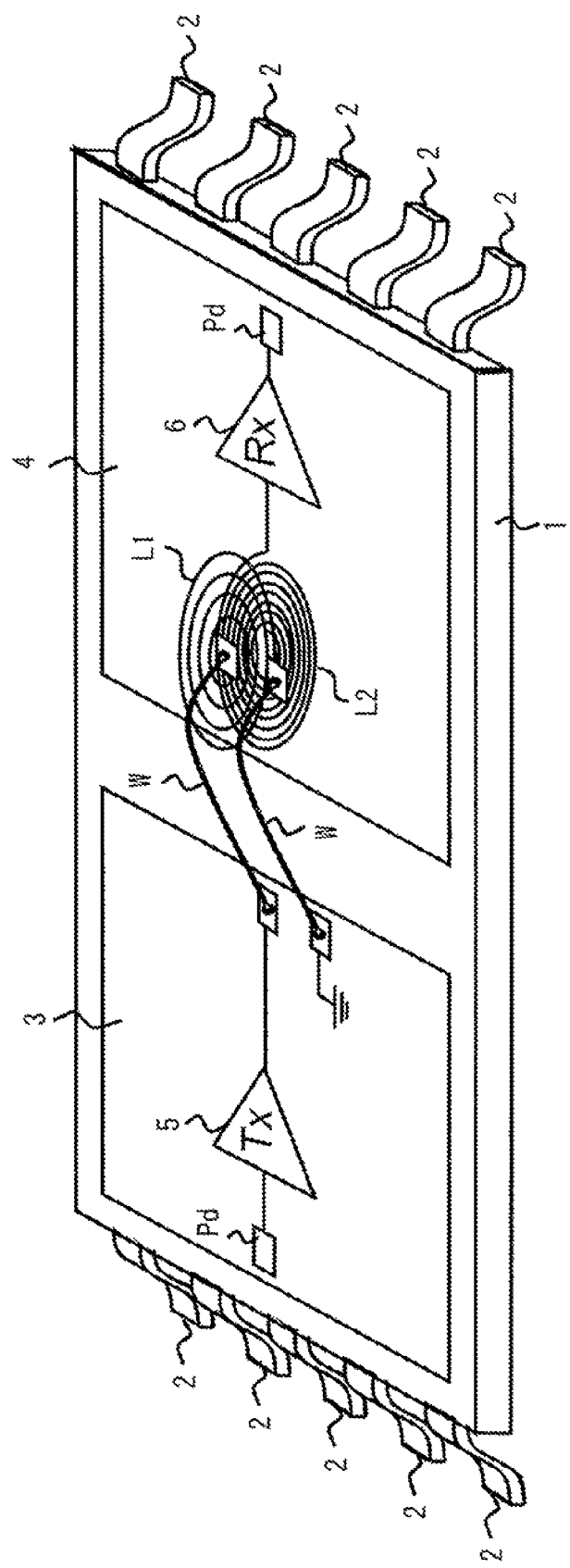
FIG. 1 is a schematic view showing a mounted state of a signal transmission system according to a first exemplary embodiment.

In the mounted state shown in FIG. 1, a first semiconductor chip 3 and a second semiconductor chip 4 are mounted in a semiconductor package 1. Each of the first semiconductor chip 3 and the second semiconductor chip 4 includes a pad Pd. The pads Pd of the first semiconductor chip 3 and the second semiconductor chip 4 are connected to lead terminals 2 which are provided in the semiconductor package 1 through bonding wires that are not shown. This configuration is common to the mounting modes shown in FIGS. 2 to 8.

A transmission circuit 5 is formed on the first semiconductor chip 3. Meanwhile, a primary coil L1, a secondary coil L2, and a reception circuit 6 are formed on the second semiconductor chip 4. A pad connected to the transmission circuit 5 is formed on the first semiconductor chip 3, and a pad connected to the primary coil L1 is formed on the second semiconductor chip 4. The transmission circuit 5 is connected to one end of the primary coil L1, which is formed above the semiconductor chip 4, through the pad and a bonding wire W. The other end of the primary coil L1 is connected to a ground line on the side of the transmission circuit 5 through the pad formed on the first semiconductor chip 3 and the bonding wire W.

Figure 2:
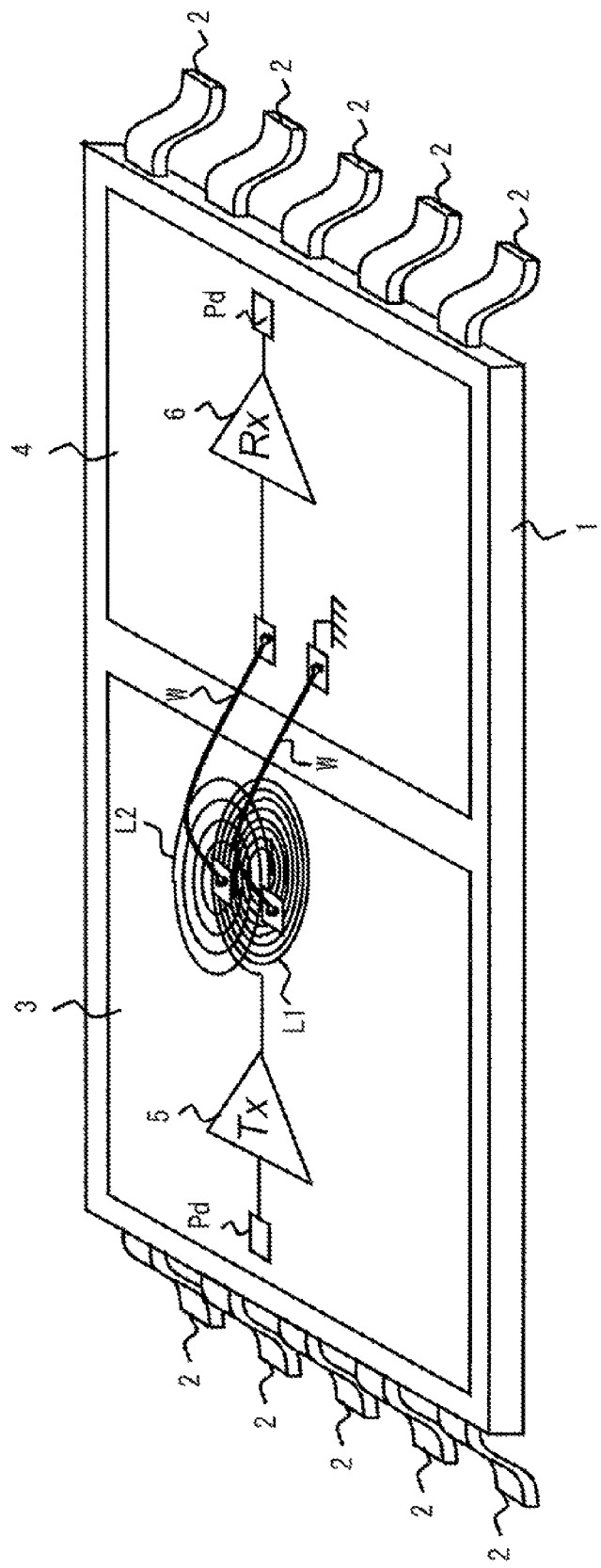
FIG. 2 is a schematic view showing a mounted state of the signal transmission system according to the first exemplary embodiment.

In the mounted state shown in FIG. 2, the primary coil L1, the secondary coil L2, and the transmission circuit 5 are formed on the first semiconductor chip 3. Meanwhile, the reception circuit 6 is formed on the second semiconductor chip 4. A pad connected to the secondary coil L2 is formed on the first semiconductor chip 3, and a pad connected to the reception circuit 6 is formed on the second semiconductor chip 4. The reception circuit 6 is connected to one end of the secondary coil L2, which is formed on the first semiconductor chip 4, through the pad and the bonding wire W. The secondary coil L2 is connected to the ground line on the side of the reception circuit 6 through the pad formed on the second semiconductor chip 4 and the bonding wire.

In the examples shown in FIGS. 1 and 2, the primary coil L1 and the secondary coil L2 are formed using a first wiring layer and a second wiring layer which are vertically stacked within one semiconductor chip.

Figure 3:
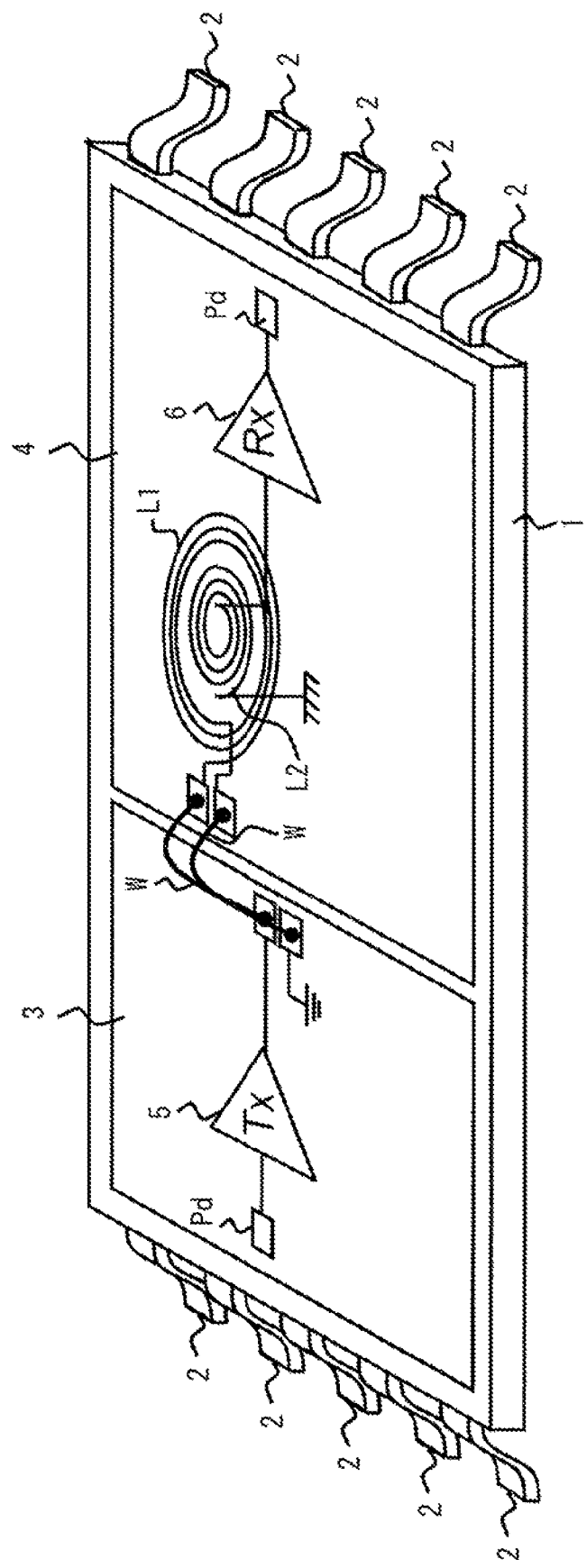
FIG. 3 is a schematic view showing a mounted state of the signal transmission system according to the first exemplary embodiment.

In the mounted state shown in FIG. 3, the transmission circuit 5 is formed on the first semiconductor chip 3. Meanwhile, the primary coil L1, the secondary coil L2, and the reception circuit 6 are formed on the second semiconductor chip 4. A pad connected to the transmission circuit 5 is formed on the first semiconductor chip 3, and a pad connected to the primary coil L1 is formed on the second semiconductor chip 4. The transmission circuit 5 is connected to one end of the primary coil L1, which is formed on the second semiconductor chip 4, through the pad and the bonding wire W. The other end of the primary coil L1 is connected to the ground line on the side of the transmission circuit 5 through the pad formed on the first semiconductor chip 3 and the bonding wire W.

Figure 4:
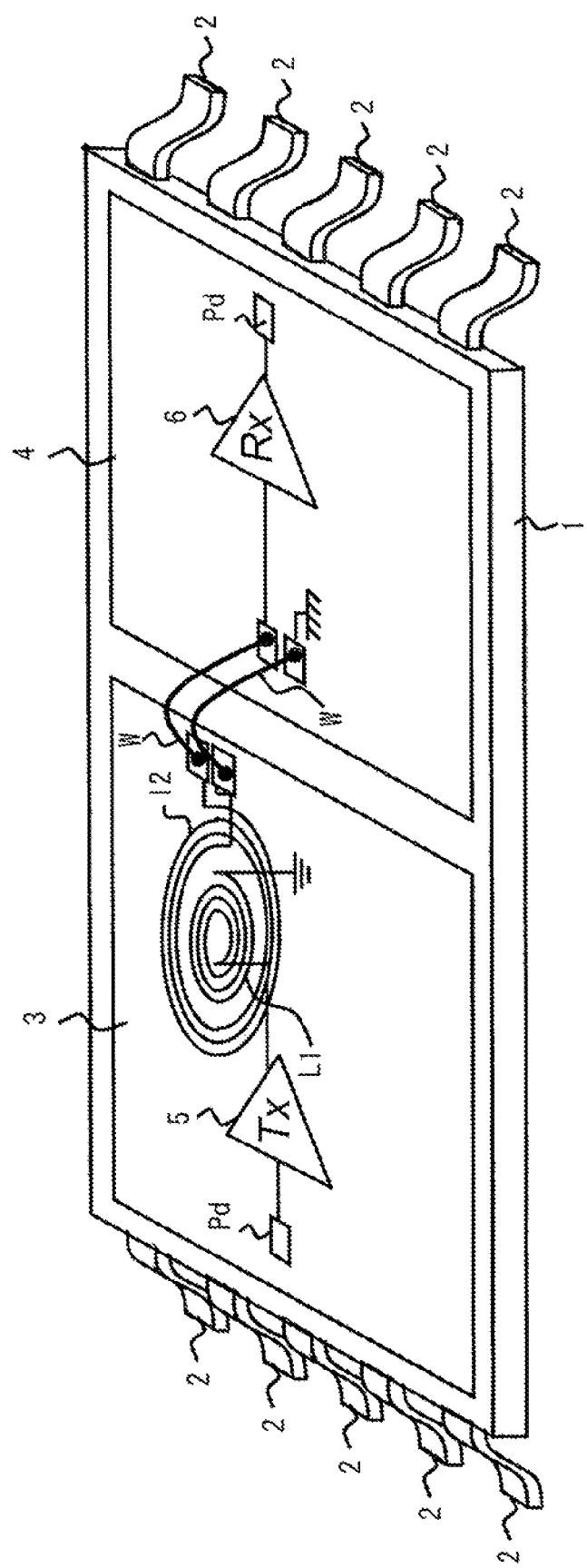
FIG. 4 is a schematic view showing a mounted state of the signal transmission system according to the first exemplary embodiment.

In the mounted state shown in FIG. 4, the primary coil L1, the secondary coil L2, and the transmission circuit 5 are formed on the first semiconductor chip 3. Meanwhile, the reception circuit 6 is formed on the second semiconductor chip 4. A pad connected to the secondary coil L2 is formed on the first semiconductor chip 3, and a pad connected to the reception circuit 6 is formed on the second semiconductor chip 4. The reception circuit 6 is connected to one end of the secondary coil L2, which is formed on the first semiconductor chip 3, through the pad and the bonding wire W. The other end of the primary coil L1 is connected to the ground line on the side of the reception circuit 6 through the pad formed on the second semiconductor chip 4 and the bonding wire W.

In the examples shown in FIGS. 3 and 4, the primary coil L1 and the secondary coil L2 are formed in the same wiring layer on one semiconductor chip. The primary coil L1 and the secondary coil L2 are formed as coils having the same center position.

Figure 5:
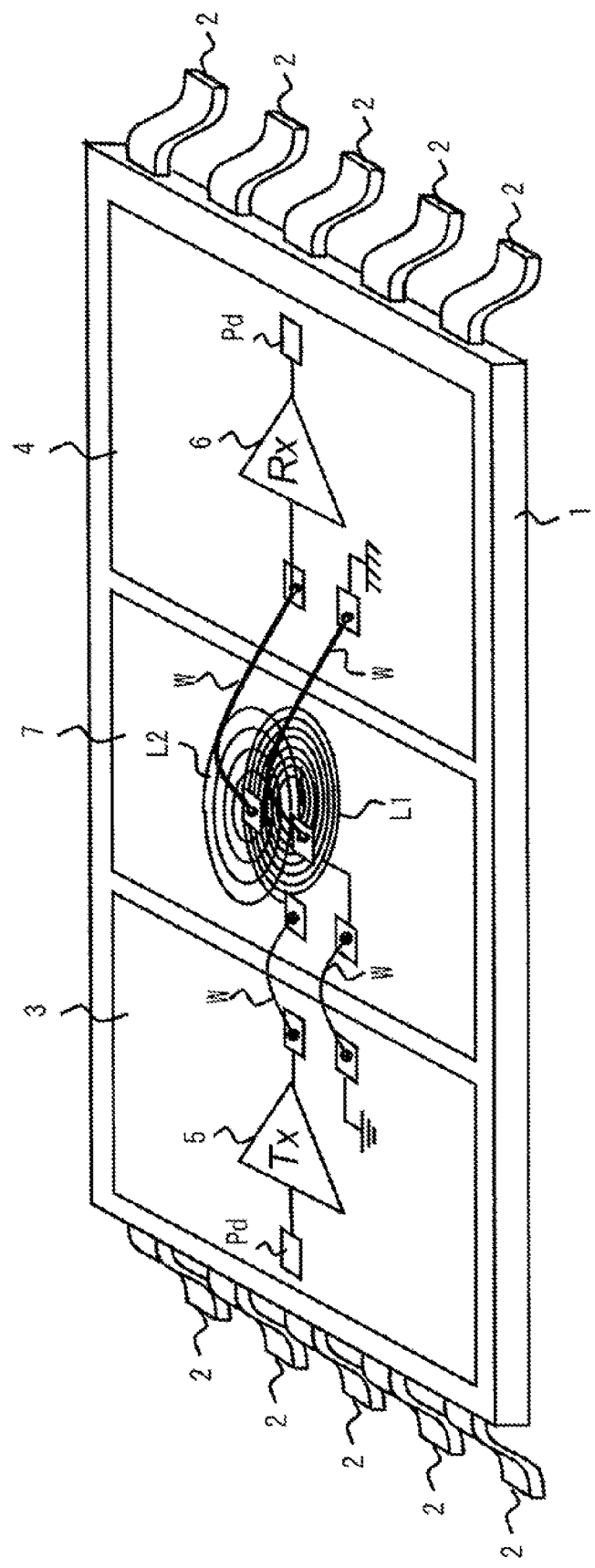
FIG. 5 is a schematic view showing a mounted state of the signal transmission system according to the first exemplary embodiment.

In the mounted state shown in FIG. 5, the transmission circuit 5 is formed on the first semiconductor chip 3; the reception circuit 6 is formed on the second semiconductor chip 4. The primary coil L1 and the secondary coil L2 are formed on a third semiconductor chip 7. A pad connected to the primary coil L1 is formed on the first semiconductor chip 3, and a pad connected to the secondary coil L2 is formed on the second semiconductor chip 4. A pad connected to the primary coil L1 and a pad connected to the secondary coil L2 are formed on the third semiconductor chip 7. The transmission circuit 5 is connected to one end of the primary coil L1, which is formed on the third semiconductor chip 7, through the pad and the bonding wire W, and the reception circuit 6 is connected to one end of the secondary coil L2, which is formed on the third semiconductor chip 7, through the pad and the bonding wire W. The other end of the primary coil L1 is connected to the ground line on the side of the transmission circuit 5 through the pad formed on the first semiconductor chip 3 and the bonding wire W, and the other end of the primary coil L2 is connected to the ground line on the side of the reception circuit 6 through the pad formed on the second semiconductor chip 4 and the bonding wire W. Note that in the example shown in FIG. 5, the primary coil L1 and the secondary coil L2 are formed using the first wiring layer and the second wiring layer which are vertically stacked within one semiconductor chip.

Figure 6:
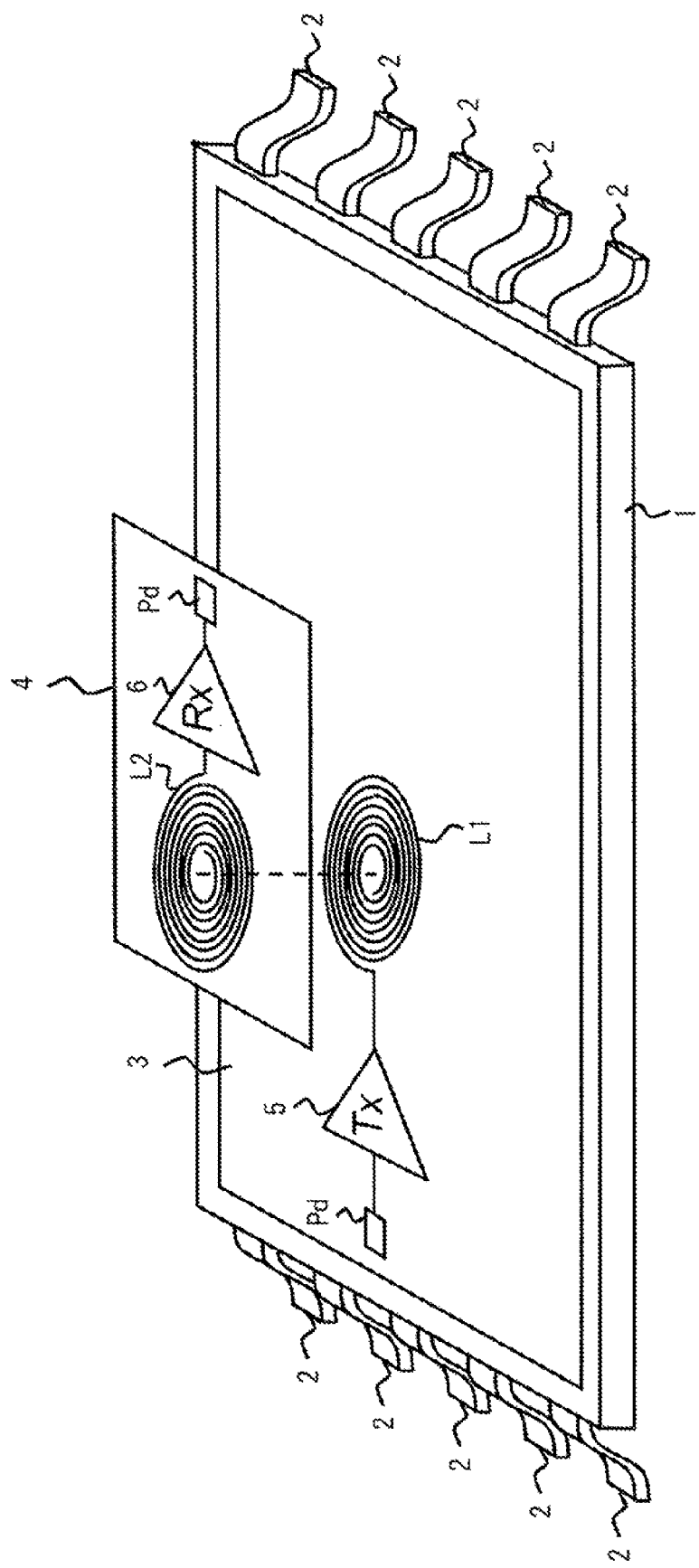
FIG. 6 is a schematic view showing a mounted state of the signal transmission system according to the first exemplary embodiment.
Figure 7:
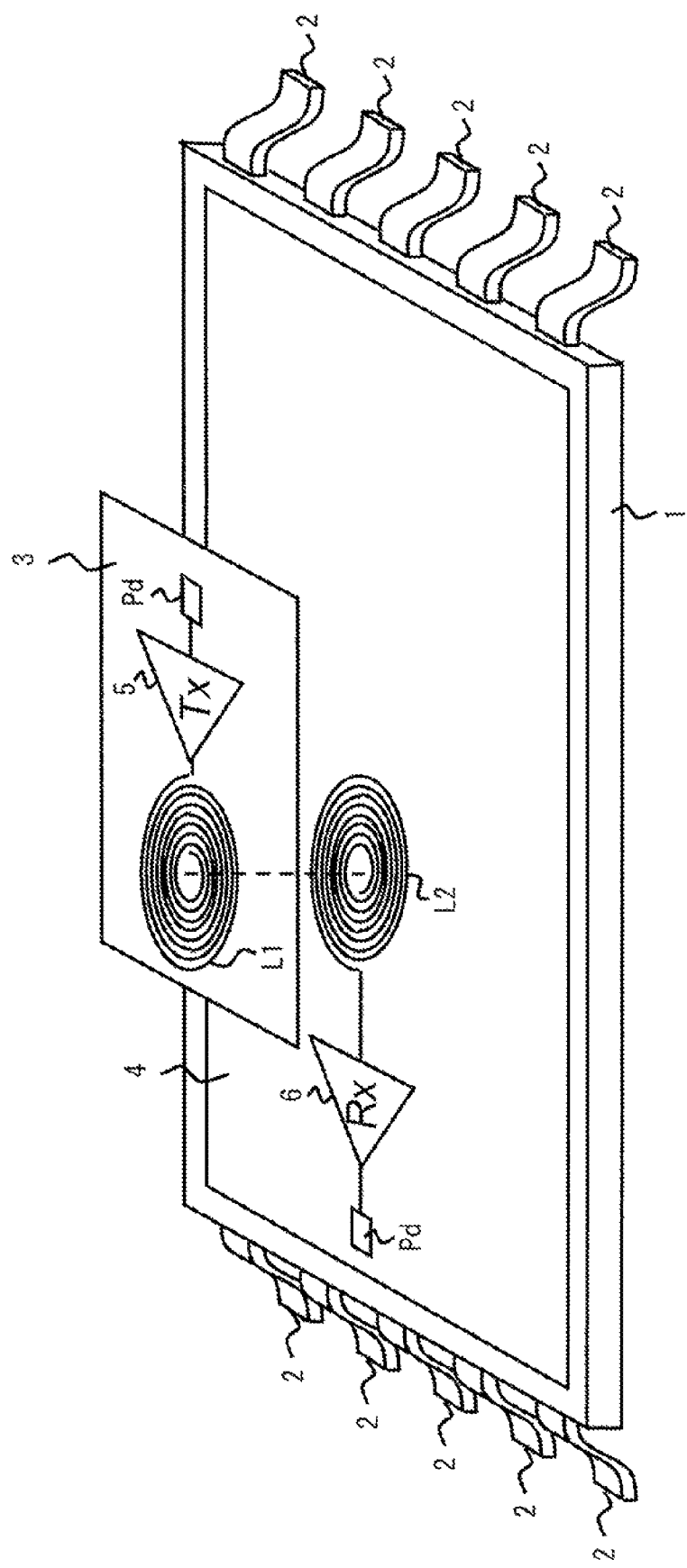
FIG. 7 is a schematic view showing a mounted state of the signal transmission system according to the first exemplary embodiment.

In the examples shown in FIGS. 6 and 7, the transmission circuit 5 and the primary coil L1 are formed on the first semiconductor chip 3, and the reception circuit 6 and the secondary coil L2 are formed on the second semiconductor chip 4. In the examples shown in FIGS. 6 and 7, the first semiconductor chip 3 and the second semiconductor chip 4 are stacked. In the examples shown in FIGS. 6 and 7, the first semiconductor chip 3 and the second semiconductor chip 4 are arranged so that the center positions of the primary coil L1 and the secondary coil L2 are aligned in the stacked state.

Figure 8:
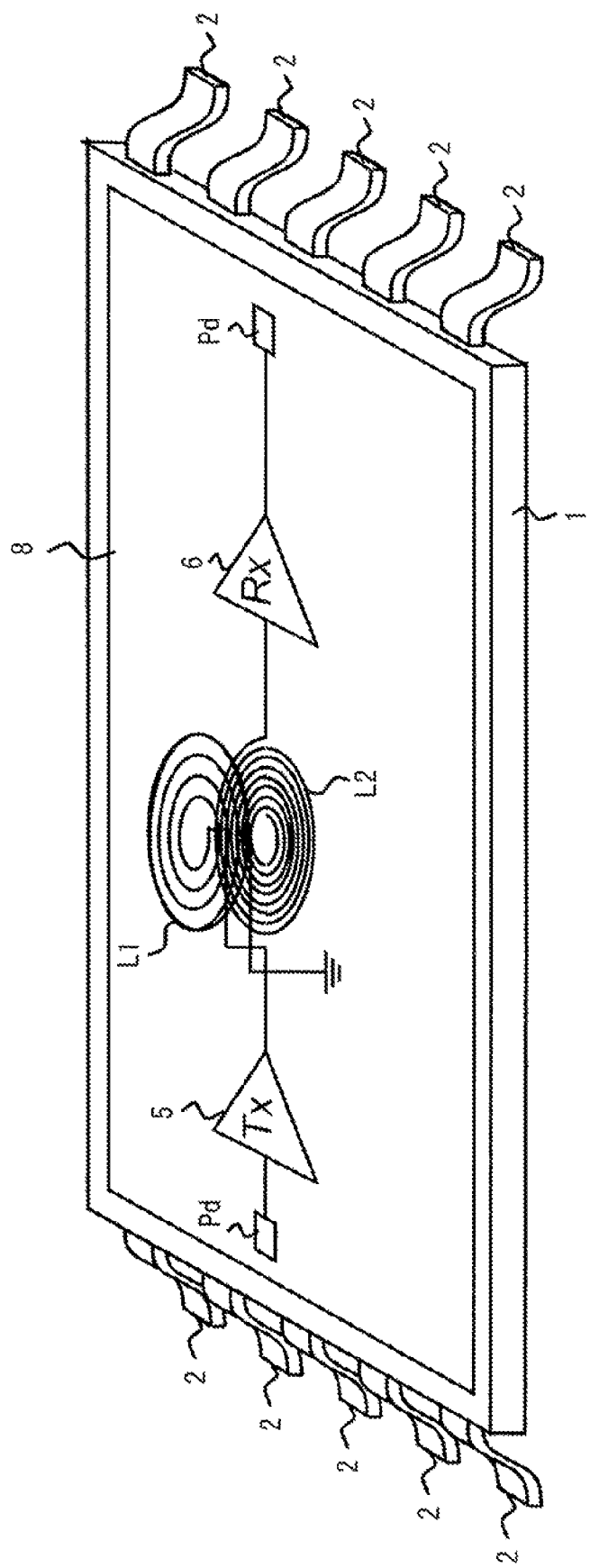
FIG. 8 is a schematic view showing a mounted state of the signal transmission system according to the first exemplary embodiment.
Figure 9:
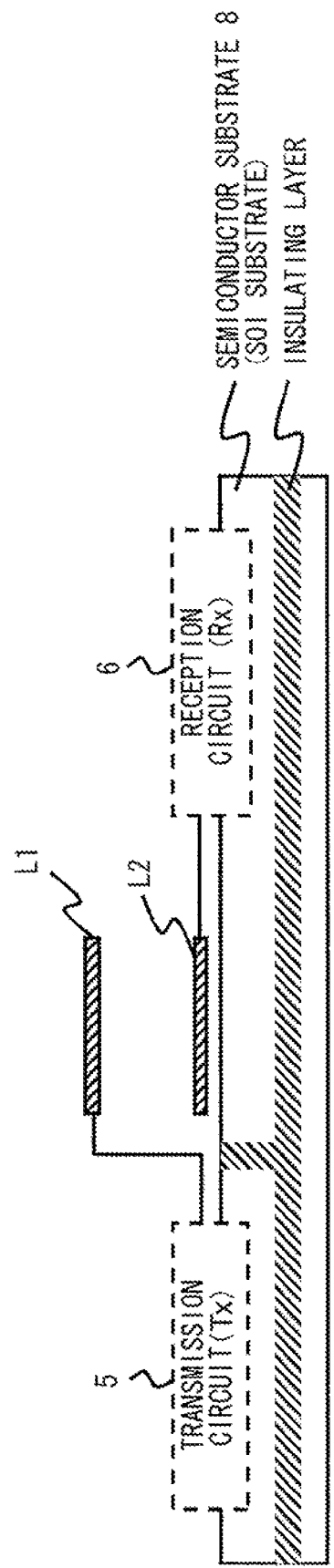
FIG. 9 is a schematic view showing a sectional view of a semiconductor substrate when a mounting method shown in FIG. 8 is employed.
Figure 10:
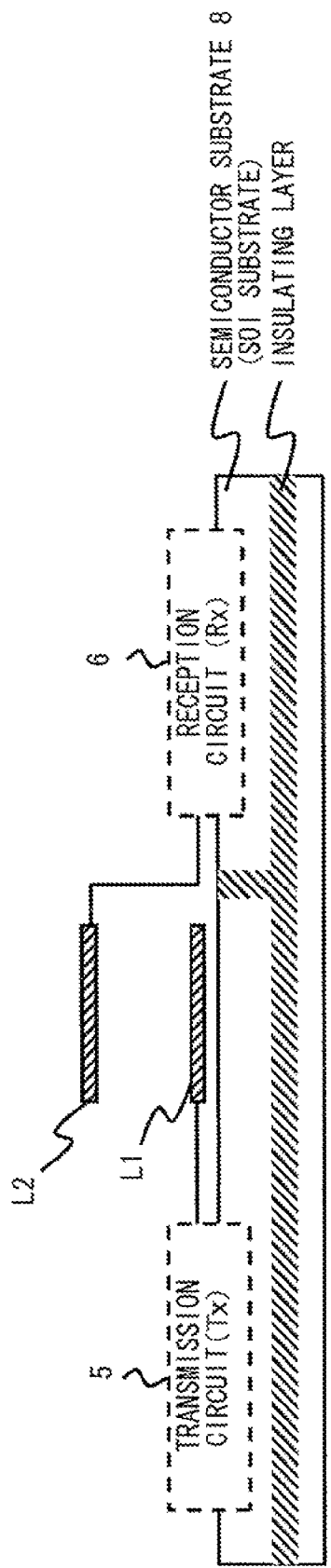
FIG. 10 is a schematic view showing a sectional view of the semiconductor substrate when the mounting method shown in FIG. 8 is employed.

In the example shown in FIG. 8, the transmission circuit 5, the reception circuit 6, the primary coil L1, and the secondary coil L2 are formed on a semiconductor substrate 8. In the example shown in FIG. 8, the primary coil L1 and the secondary coil L2 are formed using the first wiring layer and the second wiring layer which are vertically stacked. A region where the transmission circuit 5 is disposed and a region where the reception circuit 6 is disposed are electrically insulated from each other by an insulating layer formed on the semiconductor substrate 8. FIGS. 9 and 10 each show a sectional view of the semiconductor substrate 8. In the example shown in FIG. 9, the region where the transmission circuit 5 and the region where the reception circuit 6 is formed are electrically separated by an insulating layer. The primary coil L1 and the secondary coil L2 are provided in the region where the reception circuit 6 is formed. Meanwhile, in the example shown in FIG. 10, the region where the transmission circuit 5 is formed and the region where the reception circuit 6 is formed are electrically separated by an insulating layer. The primary coil L1 and the secondary coil L2 are provided in the region where the transmission circuit 5 is formed.

As described above, in the signal transmission system according to this exemplary embodiment, the transformers for use in communication are formed on the semiconductor chips. At this time, the primary coil L1 and the secondary coil L2 may be arranged so that the center positions thereof are aligned, and there is no limitation on the region where the transformers are formed. Though only the transmission circuit 5 and the reception circuit 6 are illustrated above as the circuits formed on the semiconductor chips, circuits other than the transmission circuit 5 and the reception circuit 6 may be formed on the semiconductor chips.

Figure 11:
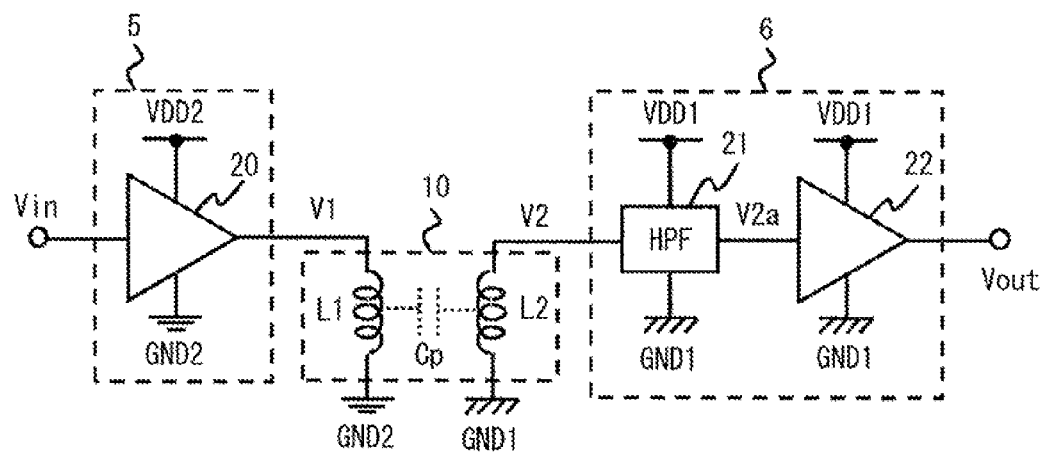
FIG. 11 is a block diagram of the signal transmission system according to the first exemplary embodiment.

Subsequently, details of the signal transmission system according to this exemplary embodiment will be described. FIG. 11 shows a block diagram of the signal transmission system according to the first exemplary embodiment. As shown in FIG. 11, the signal transmission system according to the first exemplary embodiment includes the transmission circuit 5, the reception circuit 6, and a transformer 10. The transmission circuit 5 operates based on a second power supply which belongs to a second power supply system. The second power supply includes a high-potential-side voltage (for example, a second power supply voltage VDD2) and a low-potential-side voltage (for example, a second ground voltage GND2). Meanwhile, the reception circuit 6 operates based on a first power supply which belongs to a first power supply system. The first power supply includes a high-potential-side voltage (for example, a first power supply voltage VDD1) and a low-potential-side voltage (for example, a first ground voltage GND1).

The transmission circuit 5 inclides a transmission buffer 20. The transmission buffer 20 receives input data Vin, superimposes a pulse signal having a predetermined amplitude on the input data Vin, and outputs a first transmission signal V1.

The transformer 10 includes the primary coil L1 and the secondary coil L2. One end of the primary coil L1 is connected to an output terminal of the transmission buffer 20, and the other end of the primary coil L1 is connected to the ground line on the side of the transmission circuit 5 which is supplied with the second ground voltage GND2. One end of the secondary coil L2 is connected to a noise rejection unit 21 of the reception circuit, and the other end of the secondary coil L2 is connected to the ground line on the side of the reception circuit 6 which is supplied with the first ground voltage GND1. Assume herein that a parasitic capacitor Cp is formed between the primary coil L1 and the secondary coil L2. This parasitic capacitor Cp is a capacitor in which a dielectric formed between a metal line constituting the primary coil L1 and a metal line constituting the secondary coil L2 is used as a dielectric film. Hereinafter, assume that the parasitic capacitor Cp is formed with the same configuration also in the other exemplary embodiments.

The reception circuit 6 includes the noise rejection unit 21 and a reception buffer 22. In the first exemplary embodiment, a low-pass rejection filter is used as the noise rejection unit 21. A low-pass rejection filter 21 operates using the first power supply voltage VDD1 and the first ground voltage GND1 as power supplies, and removes a low frequency component (noise) of a first reception signal V2 obtained through the secondary coil L2, thereby generating a transmission-use signal V2a. The reception buffer 22 operates using the first power supply voltage VDD1 and the first ground voltage GND1 as power supply, and transmits the transmission-use signal V2a to a circuit connected to the subsequent stage. Note that the reception buffer 22 according to the first exemplary embodiment may perform processing for reproducing data based on the pulse signal superimposed on the transmission-use signal V2a. In the first exemplary embodiment, however, only the function of the reception buffer 2 for transmitting the transmission-use signal to the circuit at the subsequent stage is described for ease of explanation.

Figure 12:
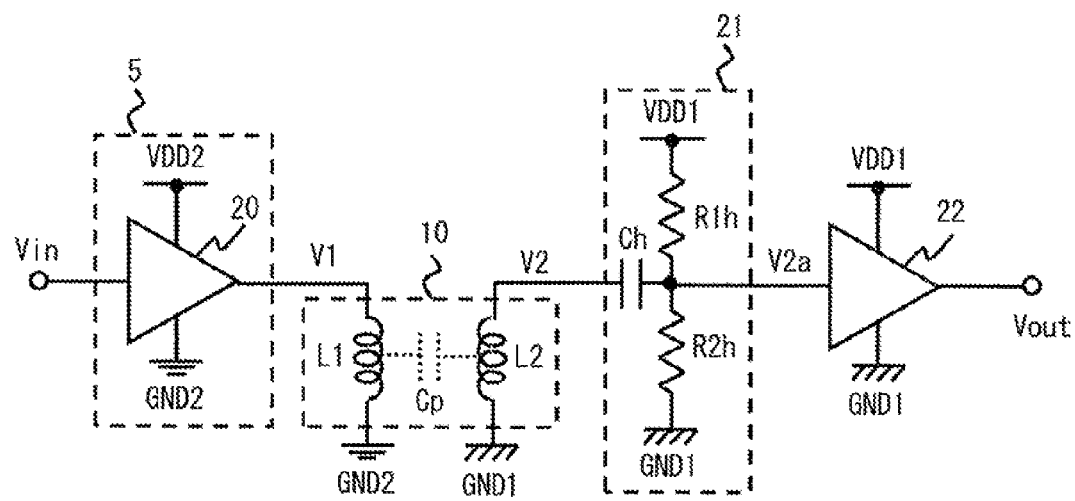
FIG. 12 is a circuit diagram of a clock multiplexing circuit according to the first exemplary embodiment including a specific circuit example of a high-pass filter.

Here, a detailed configuration of the low-pass rejection filter 21 according to the first exemplary embodiment will be described. FIG. 12 shows a block diagram of the signal transmission system including a detailed circuit of the low-pass rejection filter 21. Note that in FIG. 12, parts other than the low-pass rejection filter 21 are the same as those described with reference to FIG. 11, so the description thereof is omitted.

As shown in FIG. 12, the low-pass rejection filter includes resistors R1h and R2h and a capacitor Ch. The resistors R1h and R2h are connected in series between a power supply line supplied with the first power supply voltage VDD1 and a ground line supplied with the first ground voltage GND. A node connecting the resistor R1h and the resistor R2h is connected to one end of the capacitor Ch and to an input terminal of the reception buffer 22. The other end of the capacitor Ch is connected to one terminal of the secondary coil L2. The low-pass rejection filter 21 lowers a signal level of a signal having a frequency equal to or lower than a cut-off frequency determined by the capacitor Ch and the combined resistor of the resistors R1h and R2h, and transmits the signal to the reception buffer 22. In the first exemplary embodiment, the cut-off frequency of the low-pass rejection filter 21 is set to a frequency at which the signal level of noise between power supplies, which occurs depending on a variation period of a relative potential difference between the first ground voltage GND1 and the second ground voltage GND2 can be sufficiently reduced.

Figure 13:
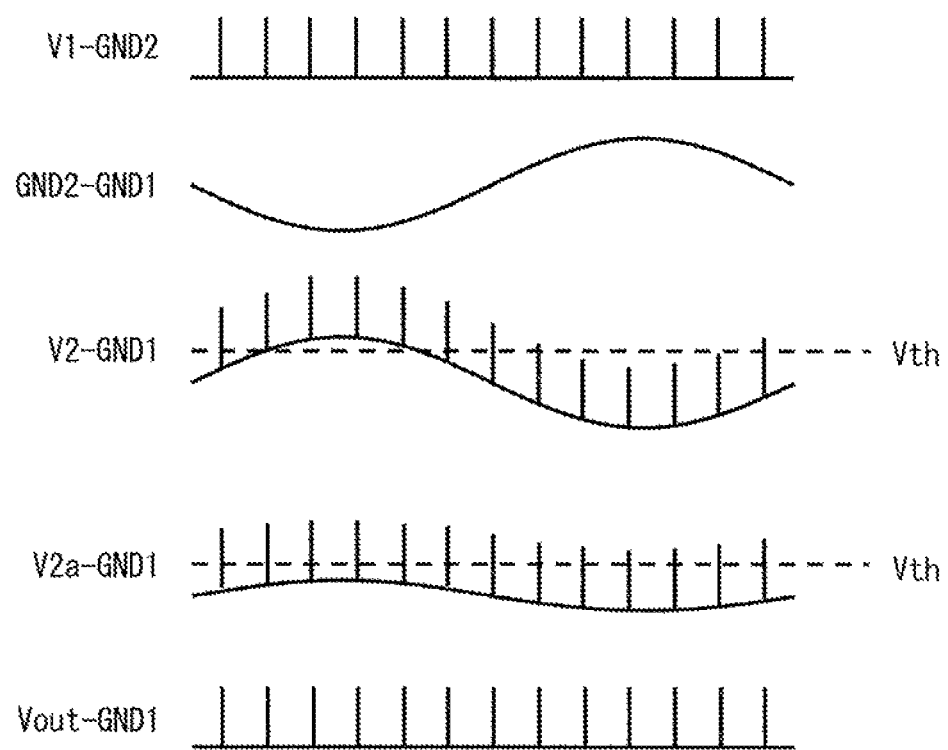
FIG. 13 is a timing diagram showing operation of the clock multiplexing circuit according to the first exemplary embodiment.

Subsequently, operation of the signal transmission system according to the first exemplary embodiment will be described. FIG. 13 is a timing diagram showing the operation of the signal transmission system according to the first exemplary embodiment. The timing diagram of FIG. 13 shows an example of the operation of the signal transmission system according to the first exemplary embodiment in the case where the noise between power supplies, which causes a signal transmission error in the signal transmission system of the related art, is generated.

As shown in FIG. 13, in the signal transmission system according to the first exemplary embodiment, the first transmission signal V1 is generated based on the second ground voltage GND2. Accordingly, no variation occurs at the low level of the first transmission signal V1 (for example, at the voltage of the second ground voltage GND2). In such a case, when a relative potential variation (hereinafter, referred to as "noise between power supplies") as indicated by GND2-GND1 in FIG. 13 occurs between the first ground voltage GND1 and the second ground voltage GND2, the first reception signal V2 has such a waveform that a pulse signal generated in the secondary coil L2 is superimposed on a signal having an opposite phase to that of the noise between power supplies based on the first transmission signal V1. In the example shown in FIG. 13, the amplitude of the noise between power supplies exceeds a threshold voltage Vth of the reception buffer 22 (a voltage at which a logic level of a signal output by the reception buffer 22 is inverted).

In the signal transmission system according to the first exemplary embodiment, the first reception signal V2 is input to the low-pass rejection filter 21, and the signal level (amplitude) of the noise between power supplies is attenuated by the low-pass rejection filter 21. As a result, the potential variation at the low level of the transmission-use signal V2a output from the low-pass rejection filter 21 becomes smaller than the threshold voltage Vth of the reception buffer 22. This transmission-use signal V2a is input to the reception buffer 22, so that the variation width of the potential difference between the low level of output data Vout, which is output from the reception buffer 22, and the first ground voltage GND1 becomes substantially zero.

As described above, in the signal transmission system according to the first exemplary embodiment, the signal level of noise between power supplies is reduced in the noise rejection unit (for example, the low-pass rejection filter 21) of the reception circuit 6. Thus, the signal transmission system according to the first exemplary embodiment prevents the noise between power supplies from affecting the reception buffer 22. That is, the signal transmission system according to the first exemplary embodiment can prevent a signal transmission error even when the provision of the low-pass rejection filter 21 causes noise between power supplies.

In a vehicle motor driving system, a compressor for an air conditioner, a refrigerator, or the like, and an AC adapter, for example, a potential difference in power supply voltage or ground voltage of an order of 100 V may be generated between a semiconductor device (for example, the transmission circuit described above), which generates a control signal, and a controlled device such as a motor driver. The noise between power supplies which is generated based on such a large potential difference has such a magnitude as to affect the signal transmission processing even when the parasitic capacitor Cp of the transformers is small and the noise between power supplies is sufficiently smaller than the potential difference between the power supplies. Therefore, as in the signal transmission system according to the first exemplary embodiment, it is possible to provide a large effect of reducing the noise between power supplies in the reception circuit 6 and preventing a signal transmission error.

Second Exemplary Embodiment

A signal transmission system according to a second exemplary embodiment will be described. Hereinafter, the elements described in the signal transmission system according to the first exemplary embodiment are denoted by the same reference numerals as those used to describe the signal transmission system according to the first exemplary embodiment, and the description thereof is omitted.

Figure 14:
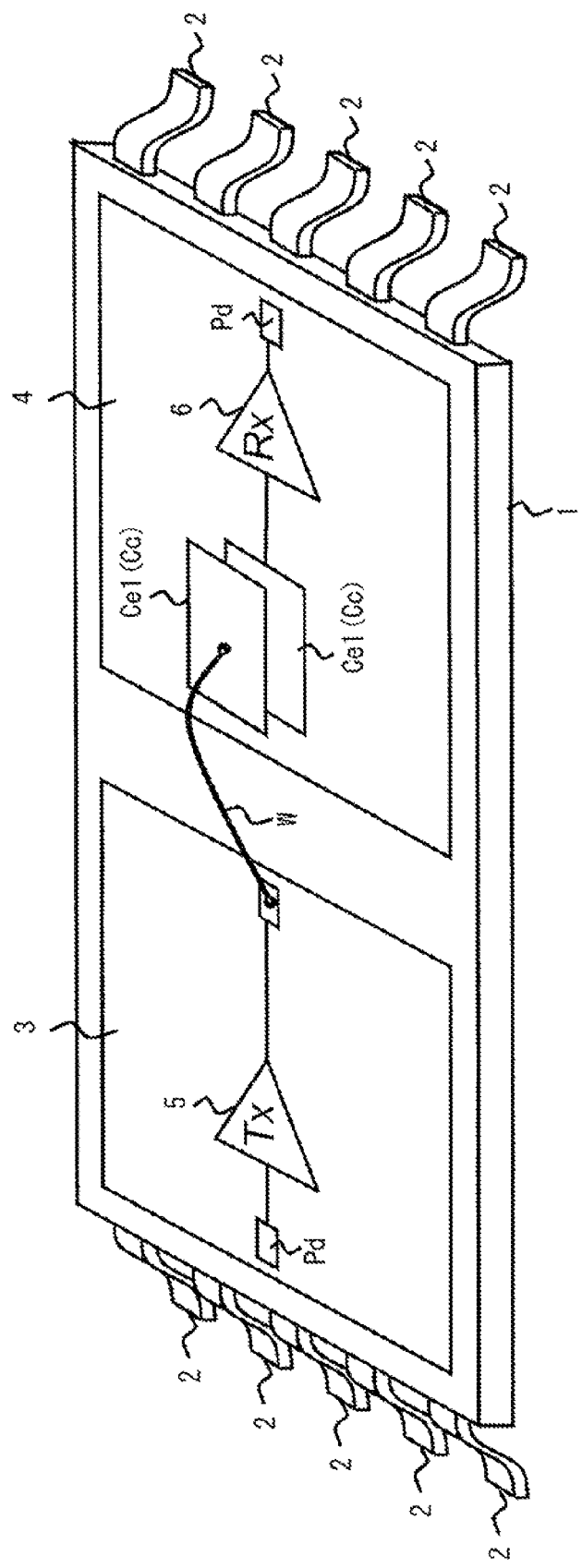
FIG. 14 is a schematic view showing a mounted state of a signal transmission system according to a second exemplary embodiment.

First, FIG. 14 shows a schematic view illustrating a mounted state of the signal transmission system according to the second exemplary embodiment. In the mounting example shown in FIG. 14, the transformers in the mounting example of the signal transmission system shown in FIG. 1 are replaced with capacitors. That is, the signal transmission system according to the second exemplary embodiment is an example using capacitors as AC coupling elements.

The capacitors for signal transmission in the signal transmission system according to the second exemplary embodiment have a configuration in which metal lines (electrodes Ce1 and Ce2 shown in FIG. 14) formed in different wiring layers are used as two electrodes and a dielectric (for example, an interlayer insulating film) filled between the metal lines is used as a dielectric.

Figure 15:
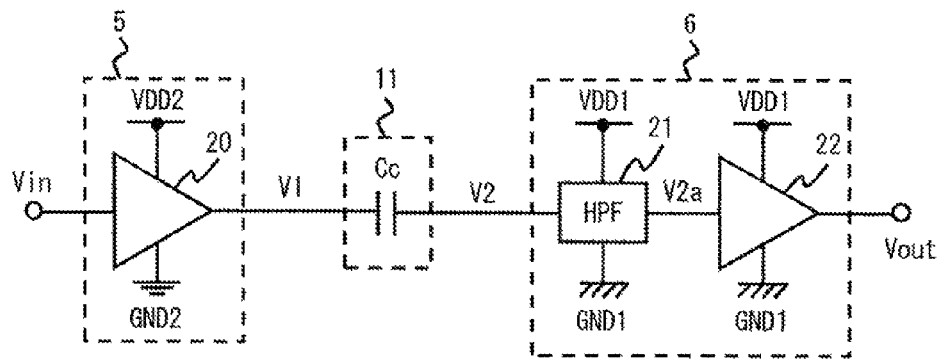
FIG. 15 is a block diagram of the signal transmission system according to the second exemplary embodiment.

Subsequently, FIG. 15 shows a block diagram of the signal transmission system according to the second exemplary embodiment. As shown in FIG. 15, in the signal transmission system according to the second exemplary embodiment, the output terminal of the transmission buffer 20 is connected to the first electrode Ce1 of a capacitor Cc, and the input terminal of the low-pass rejection filter 21 is connected to the second electrode Ce1 of the capacitor Cc.

In this manner, when the transmission circuit 5 and the reception circuit 6 are connected using the capacitor Cc as the AC coupling element, the capacitor Cc causes noise between power supplies. However, also in the signal transmission system according to the second exemplary embodiment, the low-pass rejection filter 21 is provided at the preceding stage of the reception buffer 22 in the same manner as in the first exemplary embodiment, thereby making it possible to reduce the signal level of the noise between power supplies. That is, also the signal transmission system according to the second exemplary embodiment can prevent a signal transmission error as in the first exemplary embodiment.

Third Exemplary Embodiment

A signal transmission system according to a third exemplary embodiment will be described. Hereinafter, the elements described in the signal transmission system according to the first exemplary embodiment are denoted by the same reference numerals as those used to describe the signal transmission system according to the first exemplary embodiment, and the description thereof is omitted.

Figure 16:
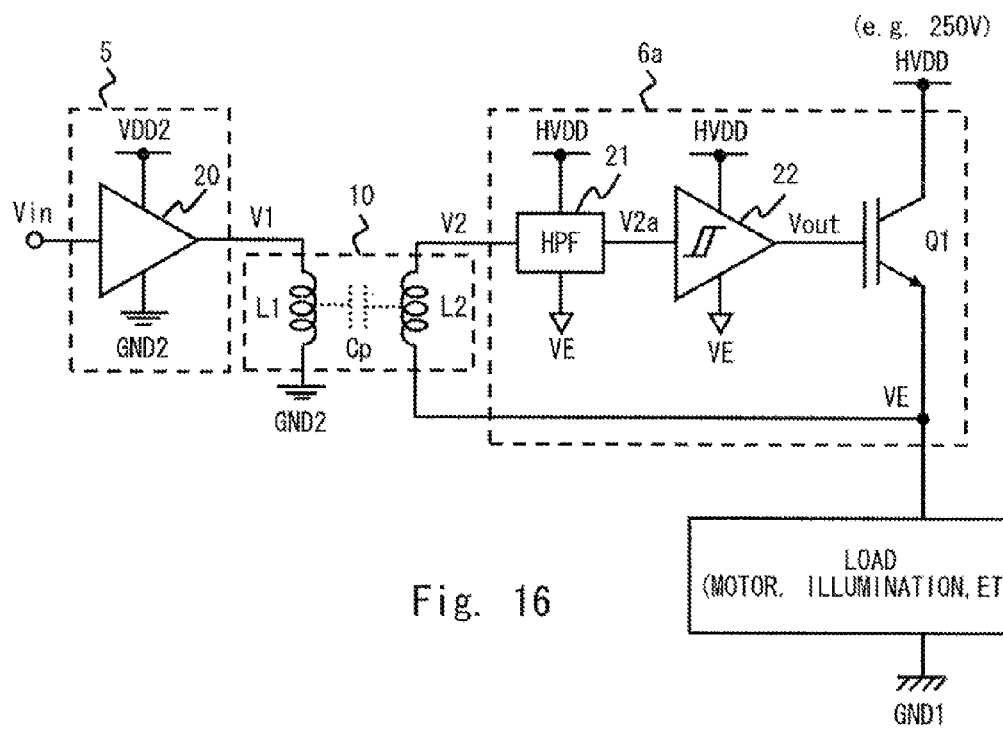
FIG. 16 is a block diagram of a signal transmission system according to a third exemplary embodiment.

FIG. 16 shows a block diagram of the signal transmission system according to the third exemplary embodiment. As shown in FIG. 16, a reception circuit 6a of the signal transmission system according to the third exemplary embodiment functions as a power supply switch for controlling power supply to a load. The reception circuit 6a includes the low-pass rejection filter 21, the reception buffer 22, and a power transistor Q1. As the power transistor Q1, a transistor with a high breakdown voltage and a high output current characteristic, such as an IGBT (Insulated Gate Bipolar Transistor), is used. The collector of the power transistor Q1 is connected to a high voltage line supplied with a first power supply voltage (for example, a high power supply voltage HVDD), and the emitter of the power transistor Q1 is connected to a load. The gate of the power transistor Q1 is connected to the output of the reception buffer 22. At the emitter of the power transistor Q1, a reference voltage VE serving as a power supply voltage for the load is generated. This reference voltage VE corresponds to the first ground voltage GND1 of the first and second exemplary embodiments in the operation of the reception circuit 6a.

In the third exemplary embodiment, the low-pass rejection filter 21 operates based on the high power supply voltage HVDD and the reference voltage VE. The configuration of the low-pass rejection filter 21 is substantially the same as that described with reference to FIG. 12. The reception buffer 22 of the third exemplary embodiment operates based on the high power supply voltage HVDD and the reference voltage VE. In the third exemplary embodiment, a hysteresis comparator is used, for example, as the reception buffer 22. The hysteresis comparator switches the output to the high level or low level according to the signal level of the transmission-use signal V2a generated in the low-pass rejection filter 21. More specifically, an upper threshold voltage Vth1 and a lower threshold voltage Vth2 are set in the hysteresis comparator used in the this exemplary embodiment. When the signal level of the transmission-use signal V2a exceeds the upper threshold voltage Vth1, the output is switched from the low level to the high level. When the output falls below the lower threshold voltage Vth2, the output is switched from the high level to the low level.

In the third exemplary embodiment, one end of the secondary coil L2 of the transformer 10 is connected to the low-pass rejection filter 21, and the other end of the secondary coil L2 is connected to the emitter of the power transistor Q1.

Note that examples of the load driven by the reception circuit 6a of the third exemplary embodiment include a motor (electric motor) and lighting. Assume that the load operates at a voltage between the reference voltage VE and the first ground voltage GND1.

Figure 17:
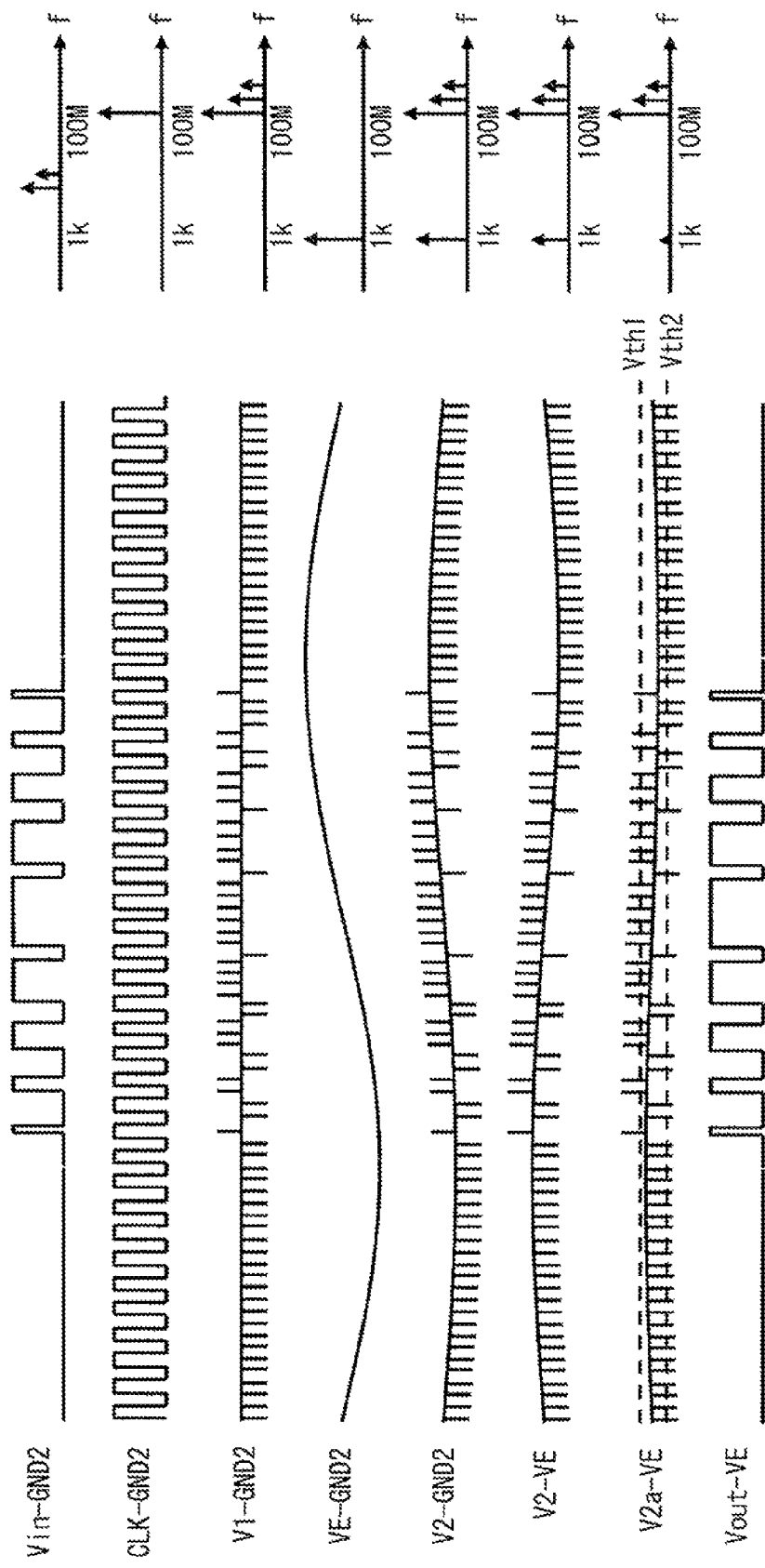
FIG. 17 is a timing diagram showing operation of the signal transmission system according to the third exemplary embodiment.

Subsequently, operation of the signal transmission system according to the third exemplary embodiment will be described. In the reception circuit 6a of the third exemplary embodiment, when turning on/off of the power transistor Q1 is switched, the potential of the reference voltage VE varies. That is, a relative potential difference between the second ground voltage GND2 on the side of the transmission circuit 5 and the reference voltage VE of the reception circuit dynamically varies. FIG. 17 shows a timing diagram of the signal transmission system according to the third exemplary embodiment.

As shown in FIG. 17, in the signal transmission system according to the third exemplary embodiment, a PWM signal is input as the input data Vin. This PWM signal is a signal having a plurality of central bands in a band of several tens of MHz. The transmission buffer 20 of the transmission circuit 5 generates the first transmission signal V1 according to the PWM signal and a clock signal CLK. The clock signal is a signal having a central band at 100 MHz. This first transmission signal V1 is transmitted to the reception circuit 6a through the transformer 10. The reception circuit 6a receives the first reception signal V2 generated in the second coil L2 of the transformer 10.

At this time, a relative potential variation indicated by VE-GND2 in FIG. 17 is generated between the second ground voltage GND2 and the reference voltage VE. This relative potential variation has a central band at about 1 kHz. Due to the relative potential variation between the power supplies, in the first reception signal V2, an amplitude center potential indicated by V2-GND2 fluctuates with respect to the second ground voltage GND2, and an amplitude center potential indicated by V2-VE fluctuates with respect to the reference voltage VE. The fluctuations of the amplitude center potentials cause the noise between power supplies.

In the reception circuit 6a, the low-pass rejection filter 21 reduces the signal level of the low frequency component (for example, noise between power supplies) of the first reception signal V2, thereby generating the transmission-use signal V2a. In this transmission-use signal V2a, the level of the signal component of 1 kHz, which corresponds to the frequency band of the noise between power supplies, is considerably lowered compared to the second reception signal V2. The amplitude at the amplitude center of the transmission-use signal V2a sufficiently falls within the range between the upper threshold voltage Vth1 and the lower threshold voltage Vth2 of the reception buffer 22. Thus, the reception buffer 22 can obtain the output data Vout in which the input data Vin is reproduced based on the pulse signal to be received as the first reception signal V2. The amplitude of the PWM signal reproduced by the reception buffer 22 does not vary with respect to the reference voltage VE, which allows the power transistor Q1 to operate normally based on the PWM signal.

As described above, also in the third exemplary embodiment, the reception circuit 6a includes the noise rejection unit (for example, the low-pass rejection filter 21), thereby improving the reliability of signal transmission even when noise between power supplies due to a relative potential difference between the second ground voltage GND2 and the reference voltage VE is generated.

In particular, in the reception circuit 6a, the reference voltage VE of the reception circuit 6a dynamically varies depending on switching on/off of the power transistor Q1, so that the noise between power supplies is liable to increase. In such a case, the effect of improving the reliability of signal transmission, which is obtained by lowering the signal level of the noise between power supplies, is large.

Additionally, in order to achieve improvement in the safety and reliability of equipment, it is extremely important to correctly control the power transistor Q1 according to the input data Vin. When the power transistor Q1 turns on for a long period of time due to occurrence of a signal transmission error, for example, an excessive current continuously flows to the load, which may cause fire or accident due to a damage of the motor or failing to stop the motor. In order to prevent such a damage or accident in the equipment, it is extremely important to correctly control the power transistor Q1.

Fourth Exemplary Embodiment

A signal transmission system according to a fourth exemplary embodiment will be described. Hereinafter, the elements described in the signal transmission system according to the first exemplary embodiment are denoted by the same reference numerals as those used to describe the signal transmission system according to the first exemplary embodiment, and the description thereof is omitted.

Figure 18:
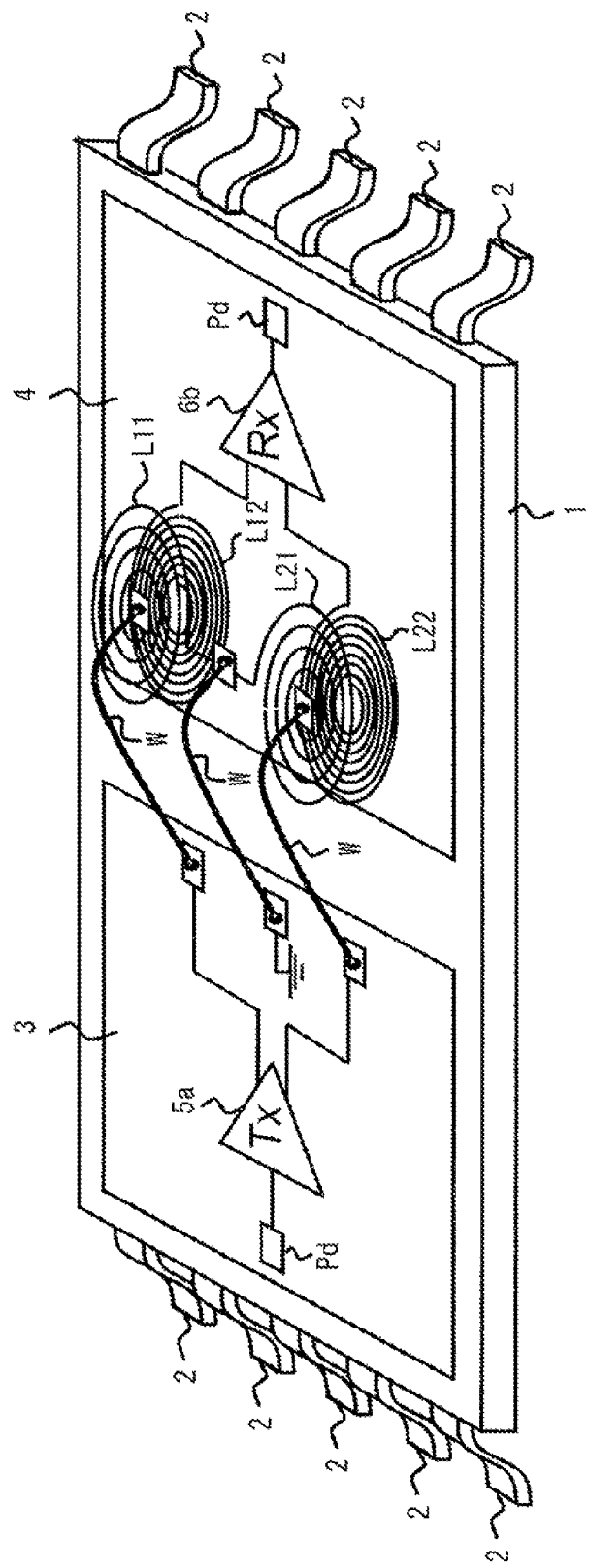
FIG. 18 is a schematic view showing a mounted state of a signal transmission system according to a fourth exemplary embodiment.
Figure 19:
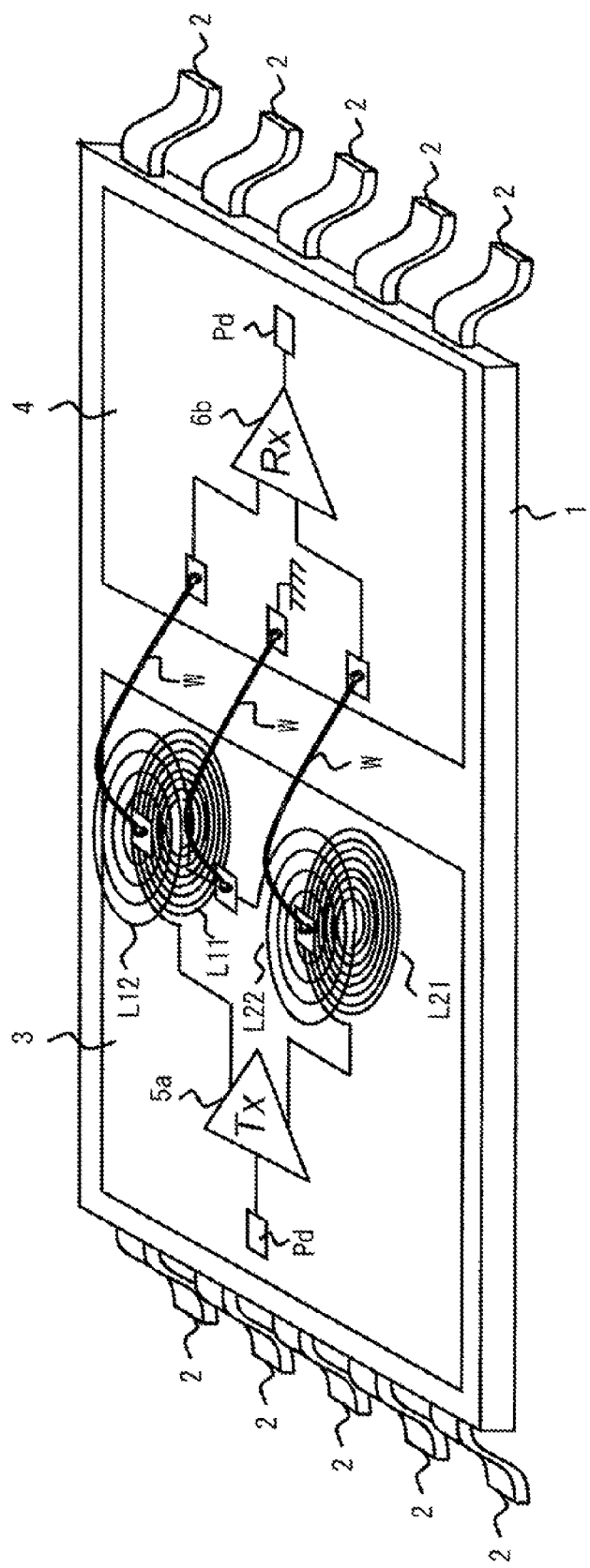
FIG. 19 is a schematic view showing a mounted state of the signal transmission system according to the fourth exemplary embodiment.

Now, FIGS. 18 and 19 show schematic views each illustrating a mounted state of the signal transmission system according to the fourth exemplary embodiment. In the mounting example shown in FIG. 18, two transformers are provided on the side of the second semiconductor chip 4, and in the mounting example shown in FIG. 19, two transformers are provided on the side of the first semiconductor chip 3. The two transformers include a first transformer having a first primary coil L11 and a first secondary coil L12; and a second transformer having a second primary coil L21 and a second secondary coil L22. One terminal of each of the first primary coil L11 and the second primary coil L21 is connected to a ground line of a transmission circuit 5a which is supplied with the second ground voltage GND2. The other terminal of each of the first primary coil L11 and the second primary coil L21 is connected to the corresponding transmission node of a transmission circuit 5a. One terminal of each of the first secondary coil L12 and the second secondary coil L22 is connected to the ground line of the reception circuit 6b which is supplied with the first ground voltage GND1. The other terminal of each of the first secondary coil L12 and the second secondary coil L22 is connected to the corresponding reception node of the reception circuit 6b.

Figure 20:
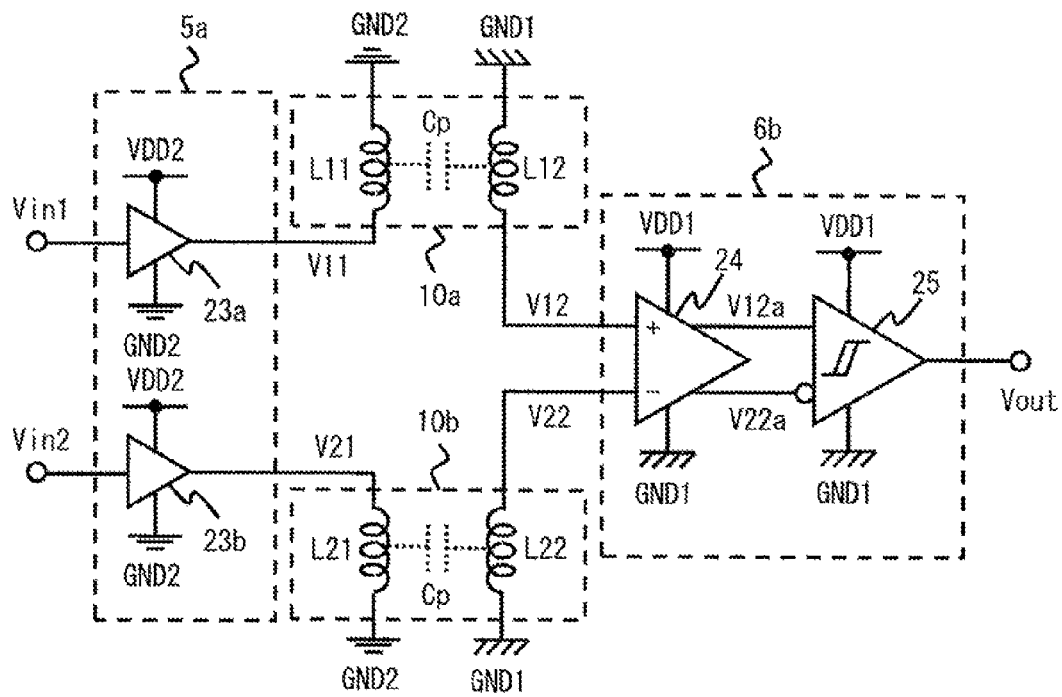
FIG. 20 is a block diagram of the signal transmission system according to the fourth exemplary embodiment.

Next, FIG. 20 shows a block diagram of the signal transmission system according to the fourth exemplary embodiment. As shown in FIG. 20, the signal transmission system according to the fourth exemplary embodiment includes the transmission circuit 5a, a first AC coupling element (for example, a transformer 10a), a second AC coupling element (for example, a transformer 10b), and the reception circuit 6b. The transformer 10a is composed of the first primary coil L11 and the first secondary coil L12, and the transformer 10b is composed of the second primary coil L21 and the second secondary coil L22. Assume that in each of the transformers 10a and 10b, the parasitic capacitor Cp is formed between two corresponding coils.

The transmission circuit 5a includes transmission buffers 23a and 23b. The transmission buffer 23a generates a first transmission signal V11 according to first input data Vin1. Further, the transmission buffer 23a drives the first primary coil L11 of the transformer 10a based on the first transmission signal V11. In this exemplary embodiment, assume that the transmission buffer 23a outputs a pulse signal when the first input data Vin1 is at a first logic level (for example, high level). The transmission buffer 23b generates a second transmission signal V21 according to second input data Vin2. Further, the transmission buffer 23b drives the second primary coil L21 of the transformer 10b based on the second transmission signal V21. In this exemplary embodiment, assume that the transmission buffer 23b outputs a pulse signal when the second input data Vin2 is at a second logic level (for example, low level). Each of the transmission buffers 23a and 23b operates based on the second power supply voltage VDD2 and the second ground voltage GND2.

In this exemplary embodiment, assume that the first input data Vin1 and the second input data Vin2 are substantially the same. Alternatively, the first input data Vin1 and the second input data Vin2 may be signals having inverted logic levels, and the transmission buffers 23a and 23b may output pulse signals when the corresponding input data is at the high level.

The reception circuit 6b includes a noise rejection unit (for example, a differential amplifier 24) and a reception buffer 25. The differential amplifier 24 operates based on the first power supply voltage VDD1 and the first ground voltage GND1. The differential amplifier 24 reduces in-phase signal components among AC components included in two input signals based on a common-mode rejection ratio (CMRR) stored in the differential amplifier. A non-inverting input terminal of the differential amplifier 24 receives a first reception signal V12 which is received through the first secondary coil L12 of the transformer 10a, and an inverting input terminal of the differential amplifier 24 receives a second reception signal V22 which is received through the second secondary coil L22 of the transformer 10b. The differential amplifier 24 outputs a first transmission-use signal V12a and a second transmission-use signal V22a based on a potential difference between the signals received at the two input terminals. The first transmission-use signal V12a and the second transmission-use signal V22a, which are output by the differential amplifier 24, include pulse signals inverted with respect to an amplitude center potential.

Figure 21:
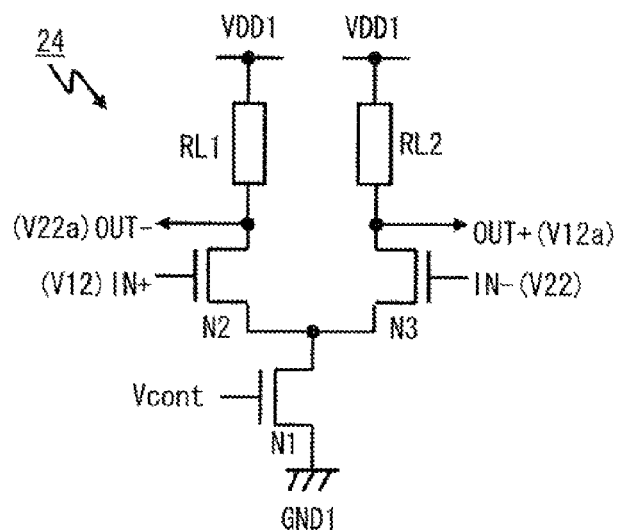
FIG. 21 is a circuit diagram of a differential amplifier according to the fourth exemplary embodiment.

Now, a detailed circuit configuration of the differential amplifier 24 will be described. FIG. 21 shows an exemplary circuit of the differential amplifier 24. In the example shown in FIG. 21, the differential amplifier 24 includes NMOS transistors N1 to N3 and load resistors RL1 and RL2. The source of the NMOS transistor N1 is supplied with the first ground voltage GND1, and the drain of the NMOS transistor N1 is connected to the drains of the NMOS transistors N2 and N3. The gate of the NMOS transistor N1 is supplied with a constant voltage Vcont. That is, the NMOS transistor N1 functions as an operating current source of the differential amplifier 24. The NMOS transistors N2 and N3 constitute a differential pair. The gate of the NMOS transistor N2 corresponds to the non-inverting input terminal of the differential amplifier 24, and the gate of the NMOS transistor N3 corresponds to the inverting input terminal of the differential amplifier 24. The source of the NMOS transistor N2 is supplied with the first power supply voltage VDD1 through the load resistor RL1. The drain of the NMOS transistor N2 serves as an inverting output terminal which outputs the second transmission-use signal V22a. The drain of the NMOS transistor N3 is supplied with the first power supply voltage VDD1 through the load resistor RL2. The drain of the NMOS transistor N3 serves as a non-inverting output terminal which outputs the first transmission-use signal V12a.

The reception buffer 25 operates based on the first power supply voltage VDD1 and the first ground voltage GND1. The reception buffer 25 is, for example, a hysteresis comparator which generates output data by reproducing input data based on the first transmission-use signal V12a and the second transmission-use signal V22a. More specifically, when a potential difference (a value of V21a-V22a) between the first transmission-use signal V12a and the second transmission-use signal V22a is positive, the reception buffer 25 sets the value of the output data Vout to the high level. When the potential difference is negative, the reception buffer 25 sets the value of the output data Vout to the low level.

Figure 22:
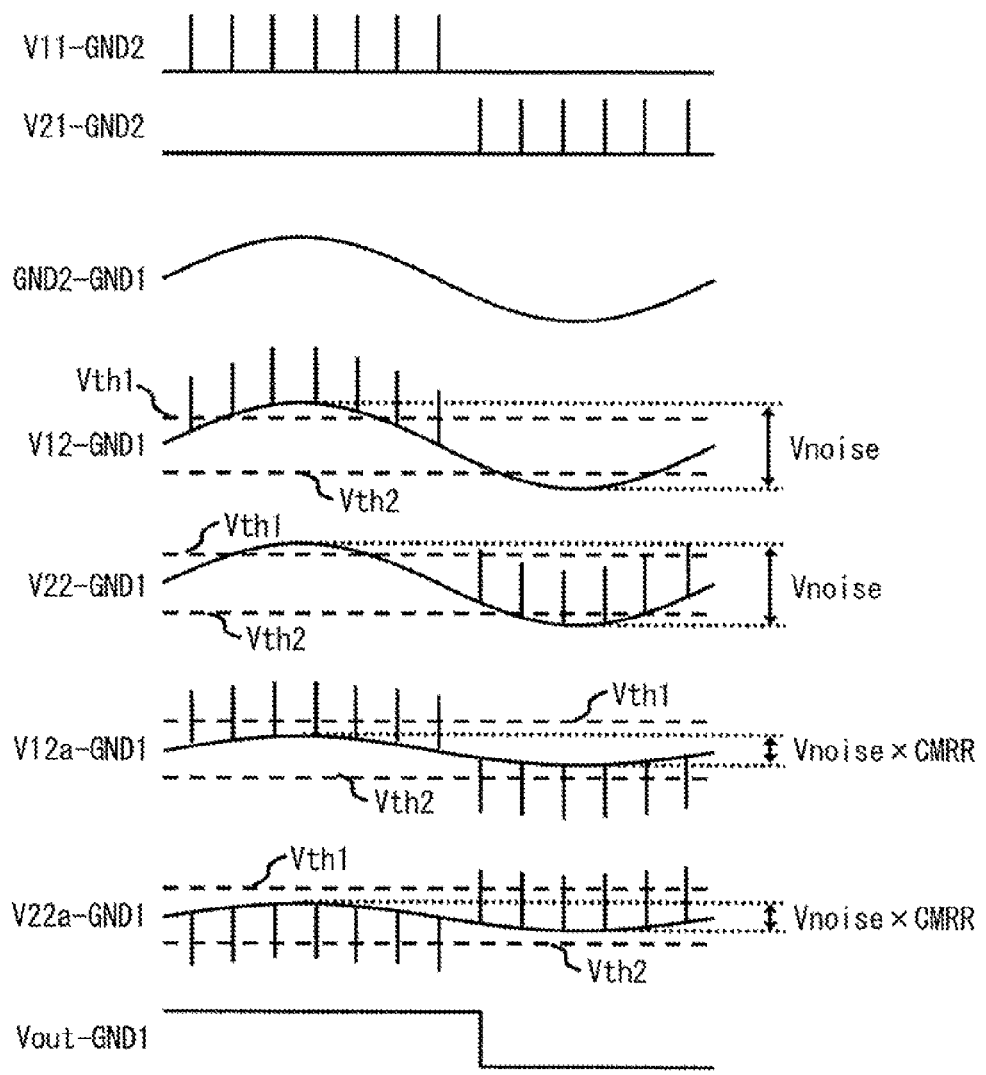
FIG. 22 is a timing diagram showing operation of the signal transmission system according to the fourth exemplary embodiment.

Subsequently, operation of the signal transmission system according to the fourth exemplary embodiment will be described. FIG. 22 is a timing diagram showing the operation of the signal transmission system according to the fourth exemplary embodiment. As shown in FIG. 22, in the signal transmission system according to the fourth exemplary embodiment, the period in which a pulse signal is superimposed on the first transmission signal V11 is different from the period in which a pulse signal is superimposed on the second transmission signal V21. The low level voltage of each of the first transmission signal V11 and the second transmission signal V21 does not vary with respect to the second ground voltage GND2.

Meanwhile, in the example shown in FIG. 22, a relative potential variation indicated by GND2-GND1 is generated between the first ground voltage GND1 and the second ground voltage GND2. Noise Vnoise between power supplies generated based on this relative potential variation is superimposed on each of the first reception signal V12 and the second reception signal V22. Accordingly, the low level of each of the first reception signal V12 and the second reception signal V22 varies depending on the noise Vnoise between power supplies with respect to the first ground voltage GND1. The magnitude of the noise Vnoise between power supplies is greater than that of a potential difference between the upper threshold voltage Vth1 and the lower threshold voltage Vth2 of the reception buffer 25.

In the signal transmission system according to the fourth exemplary embodiment, the differential amplifier 24 generates the first transmission-use signal V12a and the second transmission-use signal V22a based on the first reception signal V12 and the second reception signal V22. Herein, since the other terminals of the coils constituting the transformers 10a and 10b are connected to the power supply systems having the same relationship, the noise Vnoise between power supplies, which is superimposed on each of the first reception signal V12 and the second reception signal V22, has the same phase and the same amplitude level. At this time, the differential amplifier 24 attenuates the signal level of the noise Vnoise between power supplies based on the common-mode rejection ratio CMRR. The magnitude of the noise between power supplies after the attenuation is expressed as Vnoise×CMRR.

Thus, when the first reception signal V12 and the second reception signal V22 pass through the differential amplifier 24, the amplitude of the noise between power supplies of the first transmission-use signal V12a and the second transmission-use signal V22a is smaller than that of the potential difference between the upper threshold voltage Vth1 and the lower threshold voltage Vth2 of the reception buffer 25. As a result, the reception buffer 25 can obtain the output data Vout in which the input data Vin1 and Vin2 are reproduced based on the pulse signals transmitted by the first transmission-use signal V12a and the second transmission-use signal V22a, without being affected by the noise Vnoise between power supplies.

As described above, also in the signal transmission system according to the fourth exemplary embodiment, the provision of the noise rejection unit (for example, the differential amplifier 24) enables reduction in the adverse effect of the noise between power supplies and improvement in the reliability of data reproduction processing performed by the reception buffer 25.

The differential amplifier typically has a common-mode rejection ratio of about 1 to 0.1 percent. In other words, the differential amplifier has an effect of attenuating the amplitude of in-phase signal components to about one-hundredth to one-thousandth. Meanwhile, in order to obtain the effect of attenuating a signal to about one-hundredth to one-thousandth in a primary low-pass rejection filter, it is necessary to set a cut-off frequency that is 100 to 1000 times greater than the frequency of a signal component to be removed. Accordingly, in the case of using the primary low-pass rejection filter, when the frequency of a signal to be transmitted (for example, a pulse signal) is close to the frequency of a signal component to be removed, the amplitude attenuation effect cannot be fully exerted in some cases. In the case of using the differential amplifier as the noise rejection unit, however, the differential amplifier can obtain an excellent amplitude attenuation effect on in-phase signal components, regardless of the frequency relationship between the signal component to be removed and the signal component to be transmitted. Accordingly, the use of the differential amplifier as the noise rejection unit enables arbitrary setting of the frequency of the signal to be transmitted, regardless of the frequency of the signal to be removed, thereby improving the degree of freedom of design of the signal transmission system.

Figure 23:
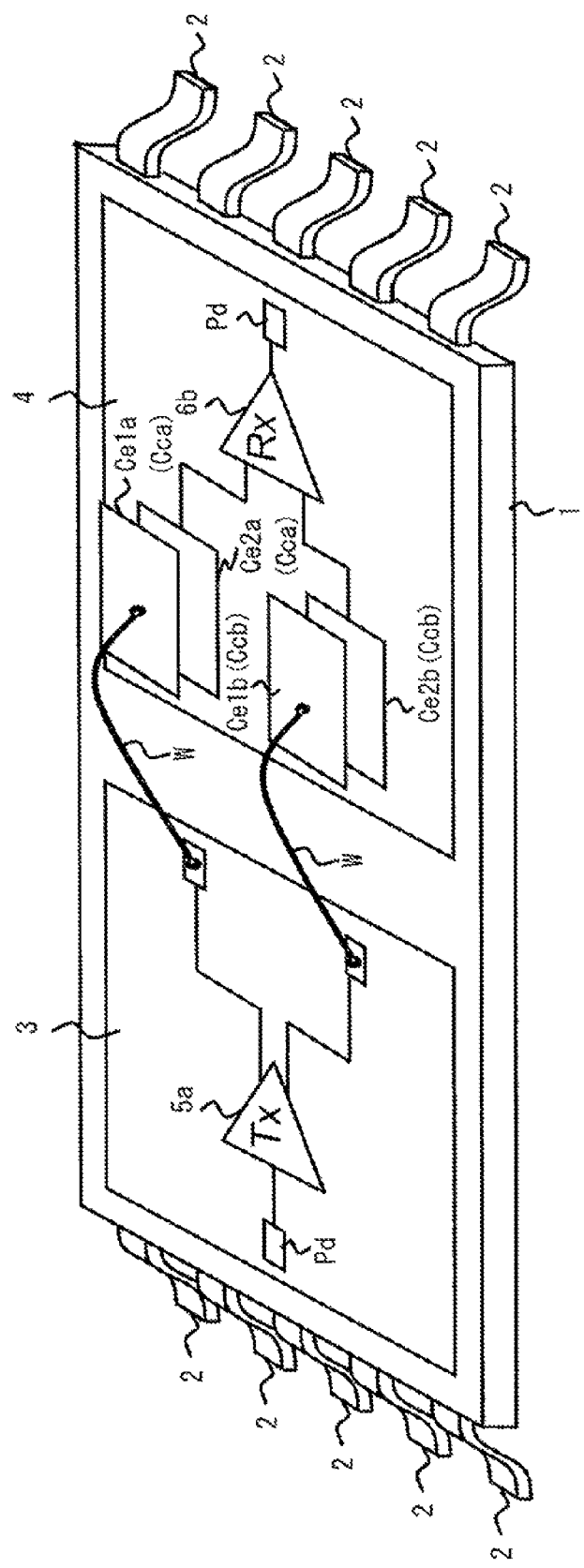
FIG. 23 is a schematic view showing a mounted state of a modified example of the signal transmission system according to the fourth exemplary embodiment.
Figure 24:
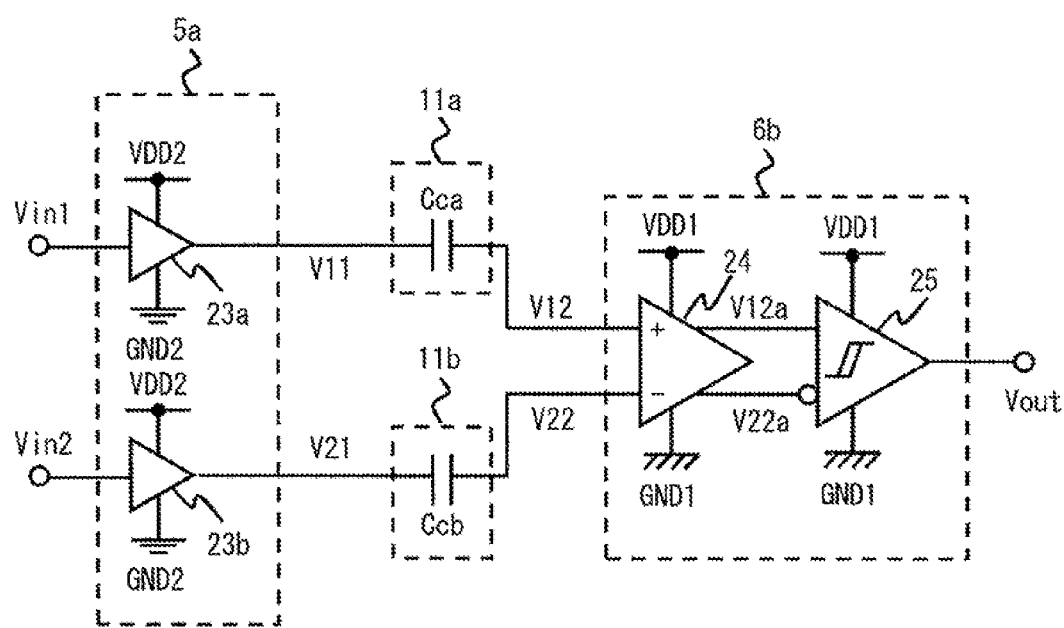
FIG. 24 is a block diagram showing a modified example of the signal transmission system according to the fourth exemplary embodiment.

Note that the reception circuit 6a according to the fourth exemplary embodiment can be applied also when capacitors are used as AC coupling elements. FIG. 23 shows a schematic view illustrating a mounted state of the signal transmission system when capacitors are used as AC coupling elements. As shown in FIG. 23, in a first modified example of the fourth exemplary embodiment, the transformer 10a and the transformer 10b are respectively replaced with a first capacitor Cca including an electrode Ce1a and an electrode Ce2a, and a second capacitor Ccd including an electrode Ce1b and an electrode Ce2b. FIG. 24 shows a block diagram of the signal transmission system according to the first modified example of the fourth exemplary embodiment. As shown in FIG. 24, in the first modified example, the transformer 10a and the transformer 10b are respectively replaced with a first capacitor 11a and a second capacitor 11b.

Thus, even when the transformers are replaced with capacitors, signals to be transmitted and received through the capacitors are the same as those in the signal transmission system according to the fourth exemplary embodiment. Accordingly, the same effect of attenuating the amplitude of the noise between power supplies as described above can be obtained.

Figure 25:
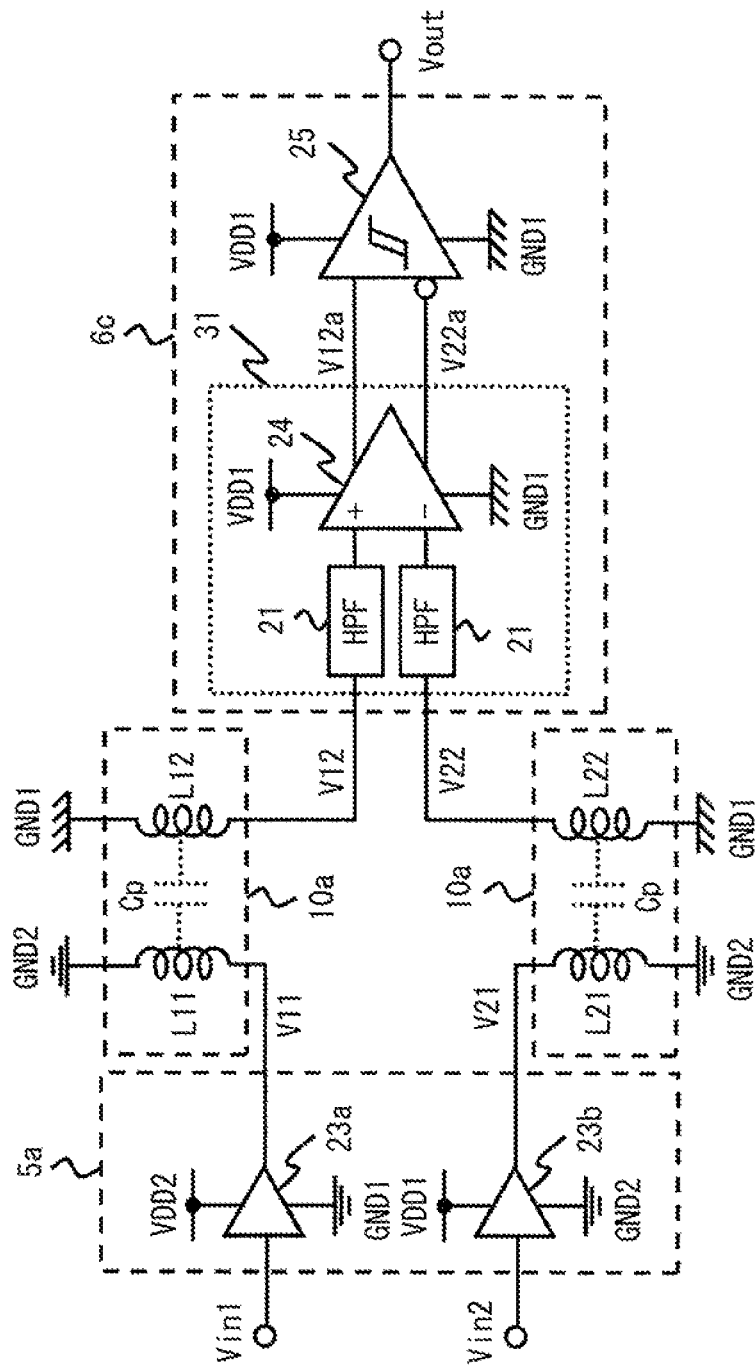
FIG. 25 is a block diagram showing a modified example of the signal transmission system according to the fourth exemplary embodiment.

FIG. 25 shows a block diagram of a signal transmission system according to a second modified example of the fourth exemplary embodiment. As shown in FIG. 25, in the second modified example of the fourth exemplary embodiment, a reception circuit 6c including a noise rejection unit 31 is illustrated. The noise rejection unit 31 includes the low-pass rejection filters 21 and the differential amplifier 24. The low-pass rejection filters 21 are provided between the non-inverting input terminal of the differential amplifier 24 and one end of the first secondary coil L12 and between the inverting input terminal of the differential amplifier 24 and one end of the second secondary coil L22. In this manner, the low-pass rejection filters 21 are provided at the preceding stage of the differential amplifier 24, so that noise between power supplies is attenuated by the low-pass rejection filters 21 and is then input to the differential amplifier 24. Thus, in the signal transmission system according to the fourth exemplary embodiment, the magnitude of the noise between power supplies of each of the first transmission-use signal V12a and the second transmission-use signal V22a can be further reduced.

Fifth Exemplary Embodiment

A signal transmission system according to a fifth exemplary embodiment will be described. Hereinafter, the elements described in the signal transmission systems according to the first and fourth exemplary embodiments are denoted by the same reference numerals as those used to describe the signal transmission systems according to the first and fourth exemplary embodiments, and the description thereof is omitted.

Figure 26:
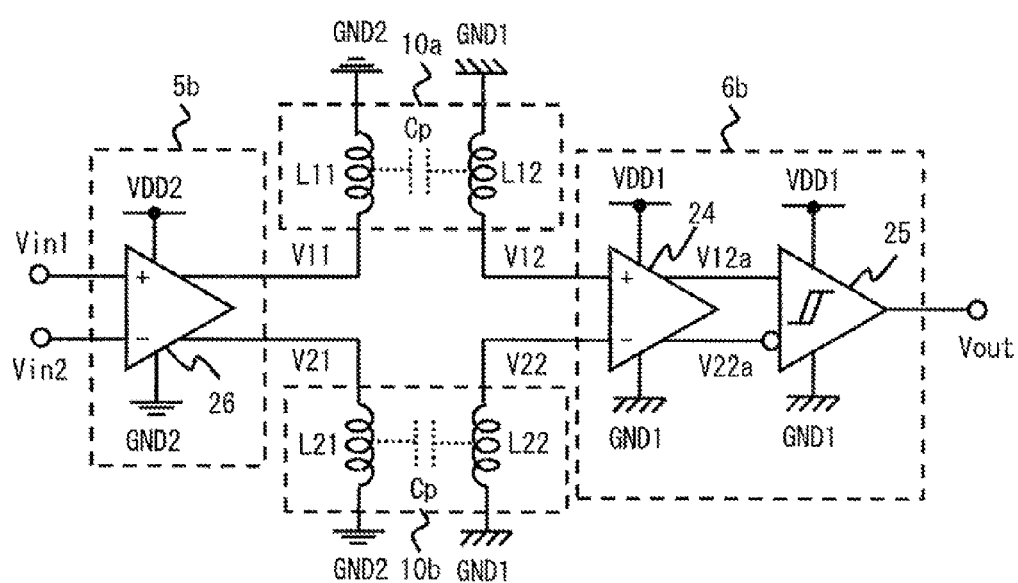
FIG. 26 is a block diagram of a signal transmission system according to a fifth exemplary embodiment.

FIG. 26 shows a block diagram of the signal transmission system according to the fifth exemplary embodiment. As shown in FIG. 26, the signal transmission system according to the fifth exemplary embodiment has a configuration in which the transmission circuit 5a of the signal transmission system according to the fourth exemplary embodiment is replaced with a transmission circuit 5b. The transmission circuit 5b includes a differential amplifier 26 serving as a transmission buffer 26. The differential amplifier 26 operates based on the second power supply voltage VDD2 and the second ground voltage GND2. The differential amplifier 26 generates the first transmission signal V11 and the second transmission signal V21, on each of which a pulse signal having a predetermined amplitude is superimposed, based on a potential difference between the first input data Vin1 and the second input data Vin2. In the fifth exemplary embodiment, the first input data Vin1 and the second input data Vin2 are inverted signals. The first transmission signal V11 and the second transmission signal V21 are signals on which pulse signals with opposite amplitude directions with respect to the amplitude center potential are superimposed.

Figure 27:
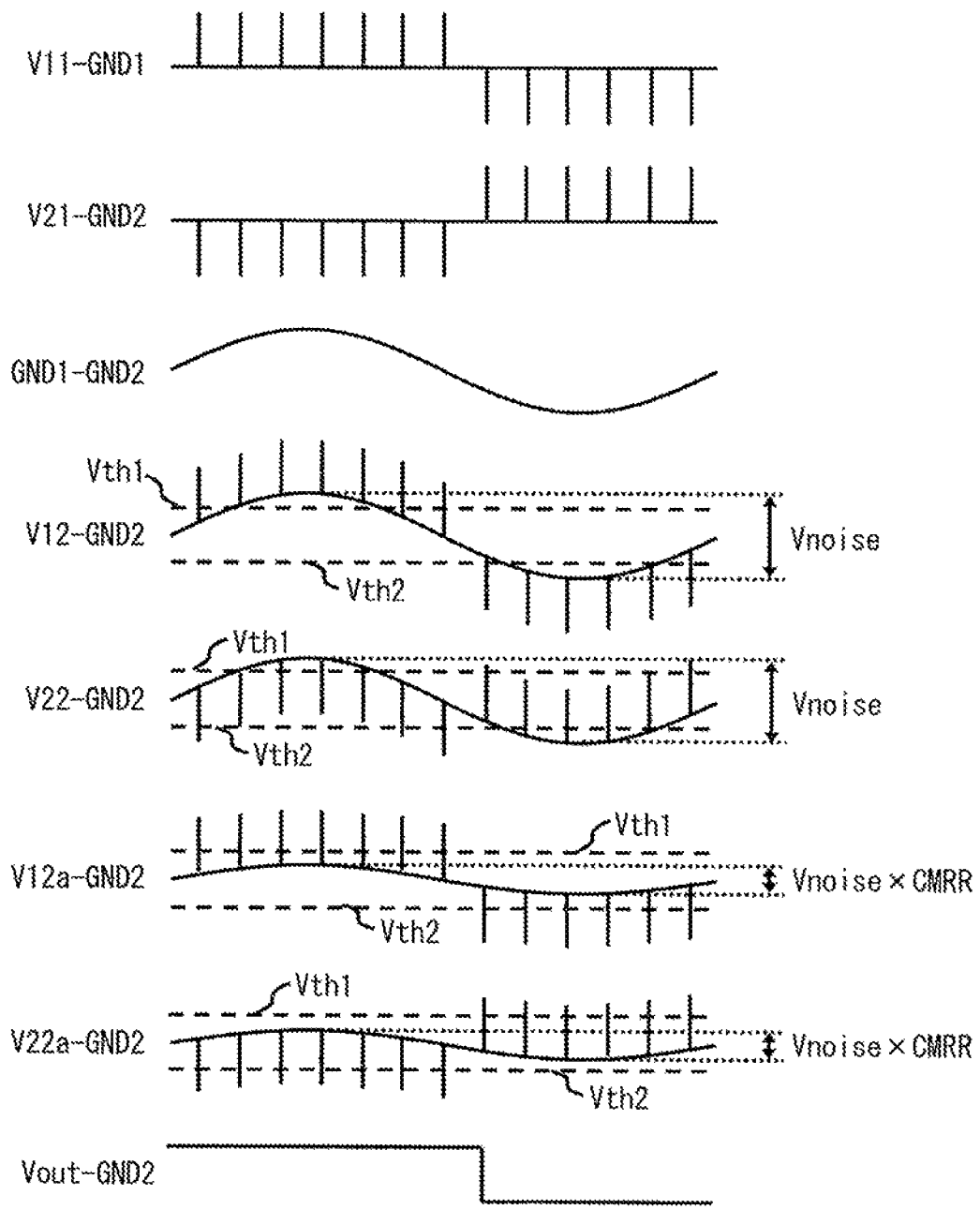
FIG. 27 is a timing diagram showing operation of the signal transmission system according to the fifth exemplary embodiment.

Subsequently, operation of the signal transmission system according to the fifth exemplary embodiment will be described. FIG. 27 is a timing diagram showing the operation of the signal transmission system according to the fifth exemplary embodiment. As shown in FIG. 27, in the signal transmission system according to the fifth exemplary embodiment, during a period in which a pulse signal which fluctuates in the positive direction with respect to the amplitude center potential is superimposed on the first transmission signal V11, a pulse signal which fluctuates in the negative direction with respect to the amplitude center potential is superimposed on the second transmission signal V21. Further, during a period in which a pulse signal which fluctuates in the negative direction with respect to the amplitude center potential is superimposed on the first transmission signal V11, a pulse signal which fluctuates in the positive direction with respect to the amplitude center potential is superimposed on the second transmission signal V21. The amplitude center potential of each of the first transmission signal V11 and the second transmission signal V21 does not vary with respect to the second ground voltage GND2.

Meanwhile, in the example shown in FIG. 27, a relative potential variation indicated by GND1-GND2 is generated between the first ground voltage GND1 and the second ground voltage GND2. The noise Vnoise between power supplies generated based on this relative potential variation is superimposed on each of the first reception signal V12 and the second reception signal V22. Accordingly, the amplitude center potential of each of the first reception signal V12 and the second reception signal V22 varies depending on the noise Vnoise between power supplies with respect to the first ground voltage GND1. The magnitude of the noise Vnoise between power supplies is greater than that of a potential difference between the upper threshold voltage Vth1 and the lower threshold voltage Vth2 of the reception buffer 25.

In the signal transmission system according to the fifth exemplary embodiment, the differential amplifier 24 generates the first transmission-use signal V12a and the second transmission-use signal V22a based on the first reception signal V12 and the second reception signal V22. Herein, since the other terminals of the coils constituting the transformers 10a and 10b are connected to the power supply systems having the same relationship, the noise Vnoise between power supplies, which is superimposed on each of the first reception signal V12 and the second reception signal V22, has the same phase and the same amplitude level. At this time, the differential amplifier 24 attenuates the signal level of the noise Vnoise between power supplies based on the common-mode rejection ratio CMRR. The magnitude of the noise between power supplies after the attenuation is expressed as Vnoise×CMRR.

Thus, when the first reception signal V12 and the second reception signal V22 pass through the differential amplifier 24, the amplitude of the noise between power supplies of the first transmission-use signal V12a and the second transmission-use signal V22a is smaller than that of the potential difference between the upper threshold voltage Vth1 and the lower threshold voltage Vth2 of the reception buffer 25. As a result, the reception buffer 25 can obtain the output data Vout in which the input data Vin1 and Vin2 are reproduced based on the pulse signals transmitted by the first transmission-use signal V12a and the second transmission-use signal V22a, without being affected by the noise Vnoise between power supplies.

As described above, in the signal transmission system according to the fifth exemplary embodiment, the form of the signal output by the transmission circuit 5b is changed from that of the signal transmission system according to the fourth exemplary embodiment, but in-phase noise between power supplies which is similar to that of the fourth exemplary embodiment is generated in the reception circuit 6b. Accordingly, the provision of the noise rejection unit (for example, differential amplifier 24) as in the fourth exemplary embodiment enables reduction in the adverse effect of the noise between power supplies and improvement in the reliability of data reproduction processing performed by the reception buffer 25.

Figure 28:
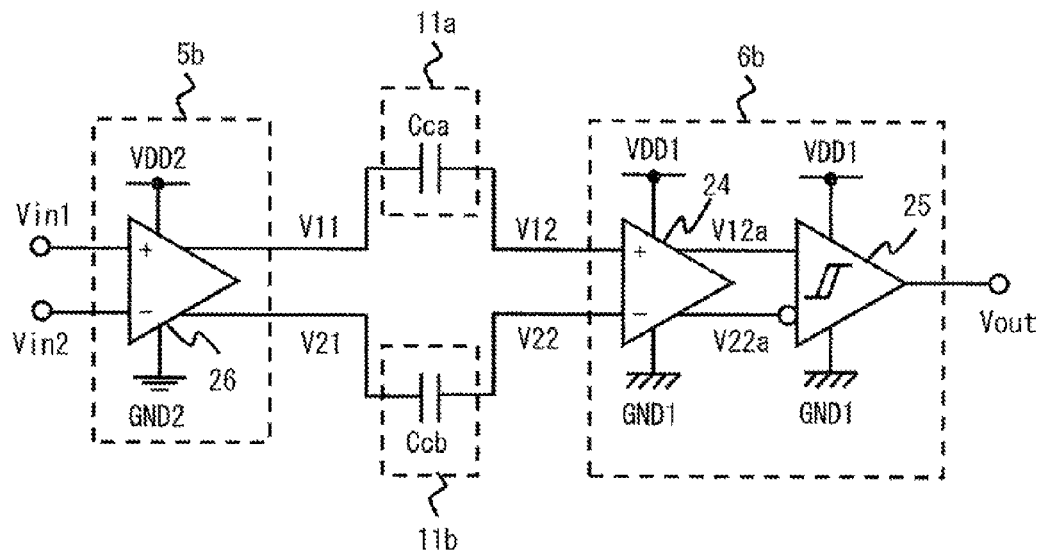
FIG. 28 is a block diagram showing a modified example of the signal transmission system according to the fifth exemplary embodiment.

Also in the fifth exemplary embodiment, capacitors may be used as AC coupling elements. FIG. 28 shows a block diagram of a modified example in which capacitors are used as AC coupling elements in the signal transmission system according to the fifth exemplary embodiment. As shown in FIG. 28, the transformers 10a and 10b shown in the block diagram of FIG. 26 are respectively replaced with the capacitors 11a and 11b, thereby implementing the modified example of the signal transmission system according to the fifth exemplary embodiment.

Sixth Exemplary Embodiment

A signal transmission system according to a sixth exemplary embodiment will be described. Hereinafter, the elements described in the signal transmission systems according to the first, fourth, and fifth exemplary embodiments are denoted by the same reference numerals as those used to describe the signal transmission systems according to the first, fourth, and fifth exemplary embodiments, and the description thereof is omitted.

Figure 29:
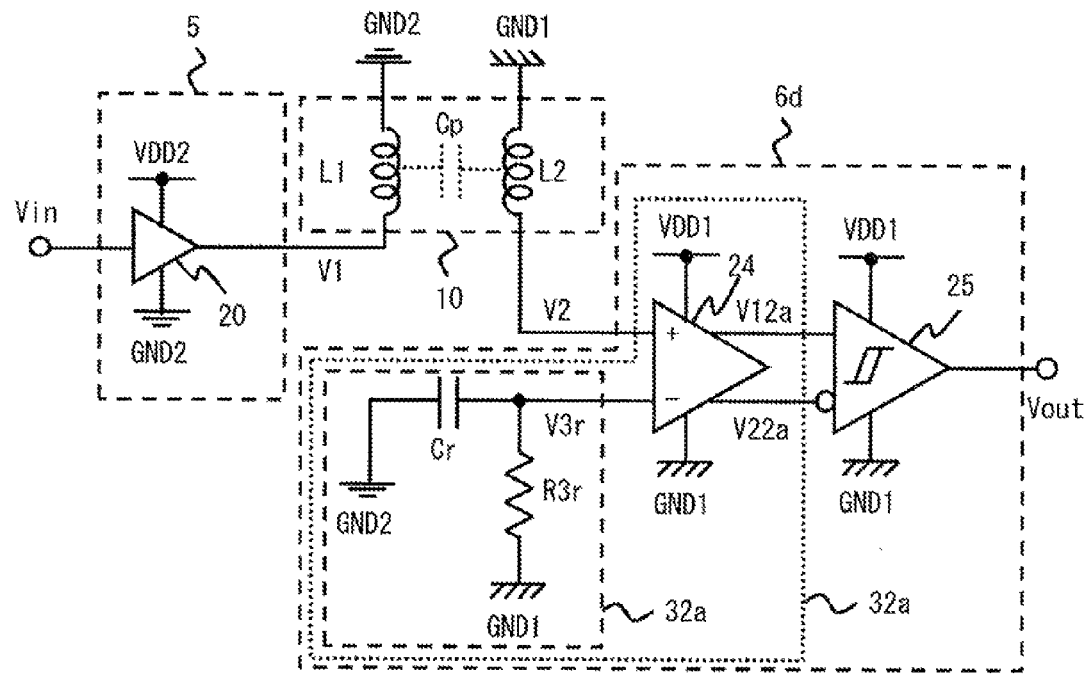
FIG. 29 is a block diagram of a signal transmission system according to a sixth exemplary embodiment.

FIG. 29 shows a block diagram of the signal transmission system according to the sixth exemplary embodiment. As shown in FIG. 29, the signal transmission system according to the sixth exemplary embodiment has a configuration in which the reception circuit 6 of the signal transmission system according to the first exemplary embodiment is replaced with a reception circuit 6d. The reception circuit 6d includes a noise rejection unit 32 and the reception buffer 25. The reception buffer 25 is identical with the reception buffer described in the fourth exemplary embodiment.

The noise rejection unit 32 includes the differential amplifier 24 and a reference noise generation unit 32a. The differential amplifier 24 is identical with the differential amplifier 24 described in the fourth exemplary embodiment. In the seventh exemplary embodiment, the non-inverting input terminal of the differential amplifier 24 receives the first reception signal V2 generated in the secondary coil L2 of the transformer 10, and the inverting input terminal of the differential amplifier 24 receives a reference noise signal V3r which is generated in the reference noise generation unit 32a.

The reference noise generation unit 32a includes a replica capacitor Cr and a resistor R3r. The replica capacitor Cr has a capacitance value substantially equal to that of the parasitic capacitor Cp which is formed between the primary coil L1 and the secondary coil L2 of the transformer 10. One terminal of the replica capacitor Cr is connected to the ground line of the transmission circuit 5 which is supplied with the second ground voltage GND2, and the other terminal of the replica capacitor Cr is connected to the inverting input terminal of the differential amplifier 24. The resistor R3r has a resistance value substantially equal to a parasitic resistance value of the secondary coil L2 of the transformer 10. One terminal of the resistor R3r is connected the ground line of the reception circuit which is supplied with the first ground voltage GND1, and the other terminal of the resistor R3r is connected to the other terminal of the replica capacitor Cr. The resistor R3r supplies a bias voltage having a voltage value corresponding to the first ground voltage GND1 to a node connecting the replica capacitor Cr and the inverting input terminal of the differential amplifier 24.

In the reference noise generation unit 32a, the replica capacitor Cr and the resistor R3r constitute an equivalent circuit of a parasitic circuit formed in the transformer 10, which causes generation of noise between power supplies. As a result, the reference noise generation unit 32a generates the reference noise signal V3r, which has the same phase and the same amplitude level as those of the noise between power supplies generated by the transformer 10, at a terminal on the side of the differential amplifier 24 of the replica capacitor Cr.

In the signal transmission system according to the sixth exemplary embodiment, the noise between power supplies superimposed on the first reception signal V2 obtained through the secondary coil L2, and the reference noise signal V3r, which have the same phase, are input to the differential amplifier 24. Accordingly, like in the case of the fourth exemplary embodiment, the differential amplifier 24 can attenuate the amplitude level of the noise between power supplies, which is superimposed on the first reception signal V2, based on the common-mode rejection ratio. That is, the first transmission-use signal V12a and the second transmission-use signal V22a of the differential amplifier 24 of the sixth exemplary embodiment are equivalent to the signals output by the differential amplifier 24 of the fourth exemplary embodiment.

As described above, in the signal transmission system according to the sixth exemplary embodiment, the provision of the reference noise generation unit 32a that generates the reference noise signal V3r having the same phase as the noise between power supplies enables reduction in the amplitude level of the noise between power supplies based on the common-mode rejection ratio of the differential amplifier 24, even when the number of signal transmission channels is one (for example, one transformer).

Seventh Exemplary Embodiment

A signal transmission system according to a seventh exemplary embodiment will be described. Hereinafter, the elements described in the signal transmission systems according to the first and fourth to sixth exemplary embodiments are denoted by the same reference numerals as those used to describe the signal transmission systems according to the first and fourth to sixth exemplary embodiments, and the description thereof is omitted.

Figure 30:
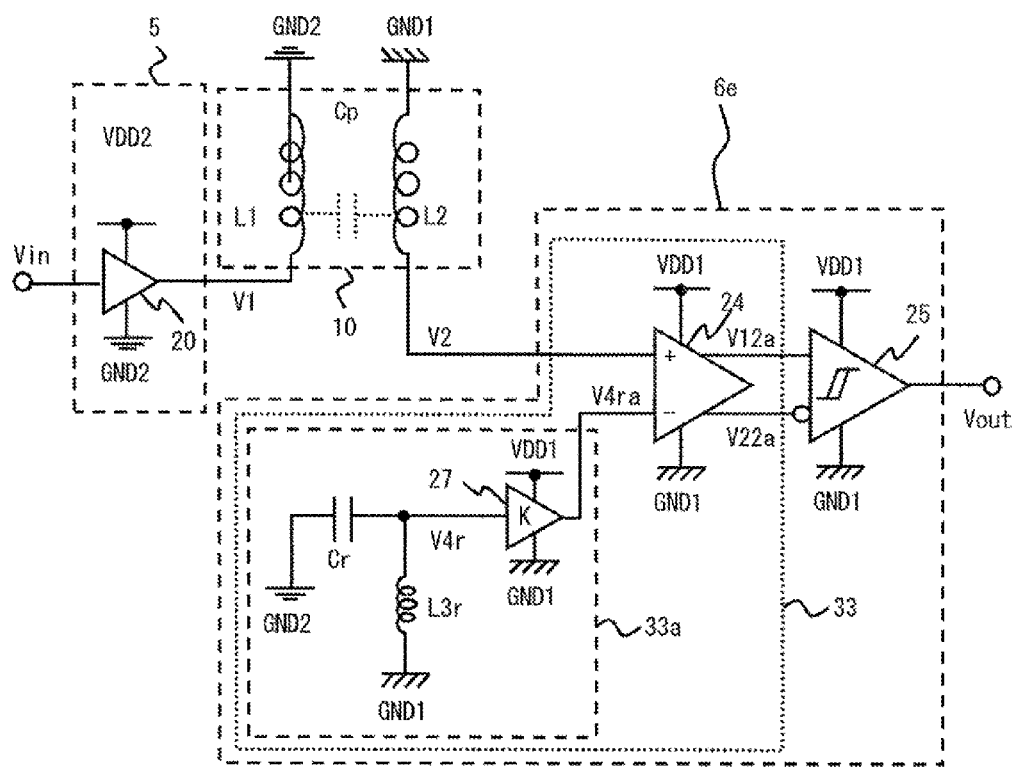
FIG. 30 is a block diagram of a signal transmission system according to a seventh exemplary embodiment.

FIG. 30 shows a block diagram of the signal transmission system according to the seventh exemplary embodiment. As shown in FIG. 30, the signal transmission system according to the seventh exemplary embodiment has a configuration in which the reception circuit 6 of the signal transmission system according to the first exemplary embodiment is replaced with a reception circuit 6e. The reception circuit 6e includes a noise rejection unit 33 and the reception buffer 25. The reception buffer 25 is identical with the reception buffer described in the fourth exemplary embodiment.

The noise rejection unit 33 includes the differential amplifier 24 and a reference noise generation unit 33a. The differential amplifier 24 is identical with the differential amplifier 24 described in the fourth exemplary embodiment. In the seventh exemplary embodiment, the non-inverting input terminal of the differential amplifier 24 receives the first reception signal V2 which is generated in the secondary coil L2 of the transformer 10, and the inverting input terminal of the differential amplifier 24 receives a second reference noise signal V4ra (a signal corresponding to the reference noise signal V3r of the sixth exemplary embodiment) which is generated in the reference noise generation unit 33a.

The reference noise generation unit 33a includes the replica capacitor Cr, a replica coil L3r, and an amplifier 27. The replica capacitor Cr according to this exemplary embodiment has a capacitance value smaller than the parasitic capacitor Cp formed between the primary coil L1 and the secondary coil L2 of the transformer 10. One terminal of the replica capacitor Cr is connected to the ground line of the transmission circuit 5 which is supplied with the second ground voltage GND2, and the other terminal of the replica capacitor C4 is connected to an input terminal of the amplifier 27. The replica coil L3r has a diameter smaller than that of the second coil L2 of the transformer 10, and has the same configuration as the secondary coil L2. The replica coil L3r is formed at a position having the same center coordinates as those of the secondary coil L2. One terminal of the replica coil L3r is connected to the ground line of the reception circuit which is supplied with the first ground voltage GND1, and the other terminal of the replica coil L3r is connected to the other terminal of the replica capacitor Cr. The amplifier 27 is provided between the replica capacitor Cr and the inverting input terminal of the differential amplifier 24. The amplifier 27 operates based on the first power supply voltage VDD1 and the first ground voltage GND1. The amplifier 27 amplifies a first reference noise signal V4r, which is generated by the replica capacitor Cr and the replica coil L3r, and outputs the second reference noise signal V4ra.

In the reference noise generation unit 33a, the replica capacitor Cr and the replica coil L3r constitute an equivalent circuit of a parasitic circuit formed in the transformer 10, which causes generation of noise between power supplies. Also in the seventh exemplary embodiment, the replica capacitor Cr and the replica coil L3r are configured to be smaller than the corresponding elements of the transformer 10. Thus, the first reference noise signal V4r, which is generated by the replica capacitor Cr and the replica coil L3r, has an amplitude smaller than that of the noise between power supplies generated by the transformer 10. In the seventh exemplary embodiment, the amplifier 27 amplifies the first reference noise signal V4r, thereby generating the second reference noise signal V4ra whose amplitude level is equal to that of the noise between power supplies. Accordingly, the reference noise generation unit 33a generates the reference noise signal V4ra, which have the same phase and the same amplitude level as those of the noise between power supplies generated by the transformer 10, at a terminal on the side of the differential amplifier 24 of the replica capacitor Cr.

In the signal transmission system according to the sixth exemplary embodiment, the noise between power supplies superimposed on the first reception signal V2 obtained through the secondary coil L2, and the reference noise signal V3r, which have the same phase, are input to the differential amplifier 24. Accordingly, like in the case of the fourth exemplary embodiment, the differential amplifier 24 can attenuate the amplitude level of the noise between power supplies, which is superimposed on the first reception signal V2, based on the common-mode rejection ratio. That is, the first transmission-use signal V12a and the second transmission-use signal V22a of the differential amplifier 24 of the seventh exemplary embodiment are equivalent to the signals output by the differential amplifier 24 of the fourth exemplary embodiment.

Furthermore, in the seventh exemplary embodiment, the provision of the replica coil L3r enhances the resistance to an external magnetic variation coming from the outside of the signal transmission system. The replica coil L3r is formed at a position having the same center coordinates as those of the secondary coil L2. Accordingly, when external noise is generated in the secondary coil L2 due to the external magnetic variation, external noise having the same phase as the secondary coil L2 is also generated in the replica coil L3r. That is, in the seventh exemplary embodiment, the first reference noise signal V4r includes a reference external noise signal reflecting a signal generated due to external noise. At the time when this reference external noise signal is amplified simultaneously with the first reference noise signal V4r and reaches the inverting input terminal of the differential amplifier 24, the reference external noise signal has the same phase and amplitude as those of the external noise generated in the secondary coil L2. Thus, in the seventh exemplary embodiment, the external noise component is attenuated in the differential amplifier 24, in the same manner as the noise between power supplies.

As described above, in the signal transmission system according to the seventh exemplary embodiment, the provision of the reference noise generation unit 33a enables improvement in the reliability during signal transmission, as in the sixth exemplary embodiment. Furthermore, in the signal transmission system according to the seventh exemplary embodiment, the capacitance value of the replica capacitor Cr is set to be smaller than that of the sixth exemplary embodiment, and the diameter of the replica coil L3r is set to be smaller than that of the secondary coil L2 of the transformer 10. In the seventh exemplary embodiment, the first reference noise signal V4r, which is generated by the replica capacitor Cr and the replica coil L3r, is amplified and output to the differential amplifier 24. The circuit area of each of the replica capacitor Cr and the replica coil L3r is typically large, while in the seventh exemplary embodiment, these elements can be formed smaller, thereby reducing the circuit area of the reception circuit 6e. Though it seems that the circuit size is increased by the amplifier 27 which is newly provided in the seventh exemplary embodiment, the entire circuit area is reduced because the amount of reduction in circuit area of the replica capacitor Cr and the replica coil L3r is much greater than the amount of increase in circuit area due to the amplifier 27.

The reception circuit 6e may be mounted in the vicinity of an electric motor such as a motor. In such a case, there is a risk that an external magnetic variation affects the operation of the transformers due to a magnetic field variation of the electric motor. In the seventh exemplary embodiment, however, the provision of the replica coil L3r can eliminate the adverse effect of the external noise generated in the secondary coil L2 due to the external magnetic variation. Thus, the reduction in noise drastically improves the reliability of the reception circuit 6e.

Eighth Exemplary Embodiment

A signal transmission system according to an eighth exemplary embodiment will be described. Hereinafter, the elements described in the signal transmission systems according to the first and fourth to seventh exemplary embodiments are denoted by the same reference numerals as those used to describe the signal transmission systems according to the first and fourth to seventh exemplary embodiments, and the description thereof is omitted.

Figure 31:
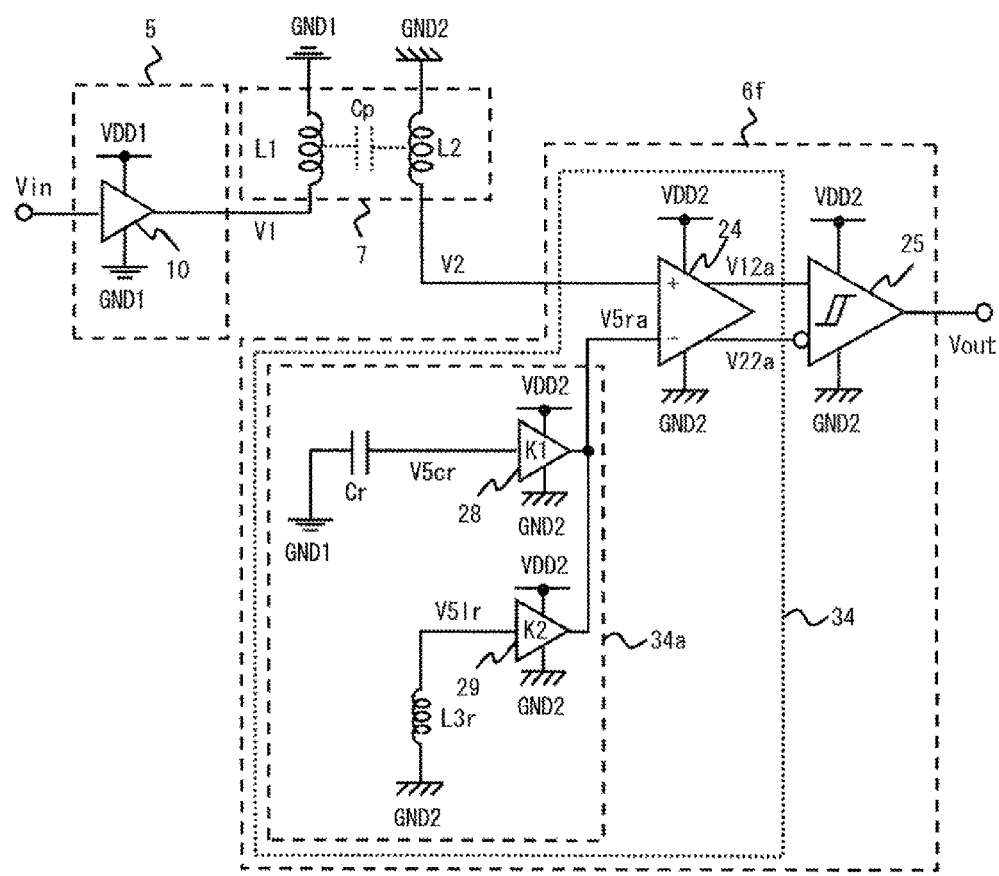
FIG. 31 is a block diagram of a signal transmission system according to an eighth exemplary embodiment.

FIG. 31 shows a block diagram of the signal transmission system according to the eighth exemplary embodiment. As shown in FIG. 31, the signal transmission system according to the eighth exemplary embodiment has a configuration in which the reception circuit 6 of the signal transmission system according to the first exemplary embodiment is replaced with a reception circuit 6f. The reception circuit 6f includes a noise rejection unit 34 and the reception buffer 25. The reception buffer 25 is identical with the reception buffer described in the fourth exemplary embodiment.

The noise rejection unit 34 includes the differential amplifier 24 and a reference noise generation unit 34a. The differential amplifier 24 is identical with the differential amplifier 24 described in the fourth exemplary embodiment. In the eighth exemplary embodiment, the non-inverting input terminal of the differential amplifier 24 receives the first reception signal V2 generated in the secondary coil L2 of the transformer 10, and the inverting input terminal of the differential amplifier 24 receives a reference noise signal V5ra (a signal corresponding to the reference noise signal V3r of the sixth exemplary embodiment) generated in the reference noise generation unit 34a.

The reference noise generation unit 34a includes the replica capacitor Cr, the replica coil L3r, and amplifiers 28 and 29. The replica capacitor Cr according to this exemplary embodiment has a capacitance value smaller than that of the parasitic capacitor Cp formed between the primary coil L1 and the secondary coil L2 of the transformer 10. One terminal of the replica capacitor Cr is connected to the ground line of the transmission circuit 5 which is supplied with the second ground voltage GND2, and the other terminal of the replica capacitor Cr is connected to an input terminal of the amplifier 28. The replica coil L3r has a diameter smaller than that of the secondary coil L2 of the transformer 10, and has the same configuration as the secondary coil L2. The replica coil L3r is formed at a position having the same center coordinates as those of the secondary coil L2. One terminal of the replica coil L3r is connected to the ground line of the reception circuit which is supplied with the first ground voltage GND1, and the other terminal of the replica coil L3r is connected to an input terminal of the amplifier 29. The amplifier 28 is provided between the replica capacitor Cr and the inverting input terminal of the differential amplifier 24.

The amplifier 28 operates based on the first power supply voltage VDD1 and the first ground voltage GND1. Further, the amplifier 28 amplifies and outputs a reference noise signal V5cr between power supplies which is generated by the replica capacitor Cr. The amplifier 29 operates based on the first power supply voltage VDD1 and the first ground voltage GND1. Further, the amplifier 29 amplifies and outputs a reference external noise signal V5Ir generated in the replica coil L3r. The amplifiers 28 and 29 combine their outputs to generate the reference noise signal V5ra. The amplifiers 28 and 29 have amplification factors independent from each other. Note that the amplifiers 28 and 29 may have the same amplification factor.

As described above, the reference noise generation unit 34a according to the eight exemplary embodiment corresponds to a configuration in which the replica capacitor Cr and the replica coil L3r are separately provided with the amplifier 27 of the reference noise generation unit 33a according to the seventh exemplary embodiment. With this configuration, the capacitance value of the replica capacitor Cr can be set independently from the inductance value of the replica coil L3r. The amplifiers 28 and 29 set the magnitude of the reference noise signal V5cr between power supplies and the magnitude of the reference external noise signal V5Ir, respectively, thereby obtaining the reference noise signal V5r equivalent to the reference noise signal V4ra according to the seventh exemplary embodiment. That is, the reference noise generation unit 34a according to the eighth exemplary embodiment can be designed more freely than the reference noise generation unit 33a according to the seventh exemplary embodiment.

Figure 32:
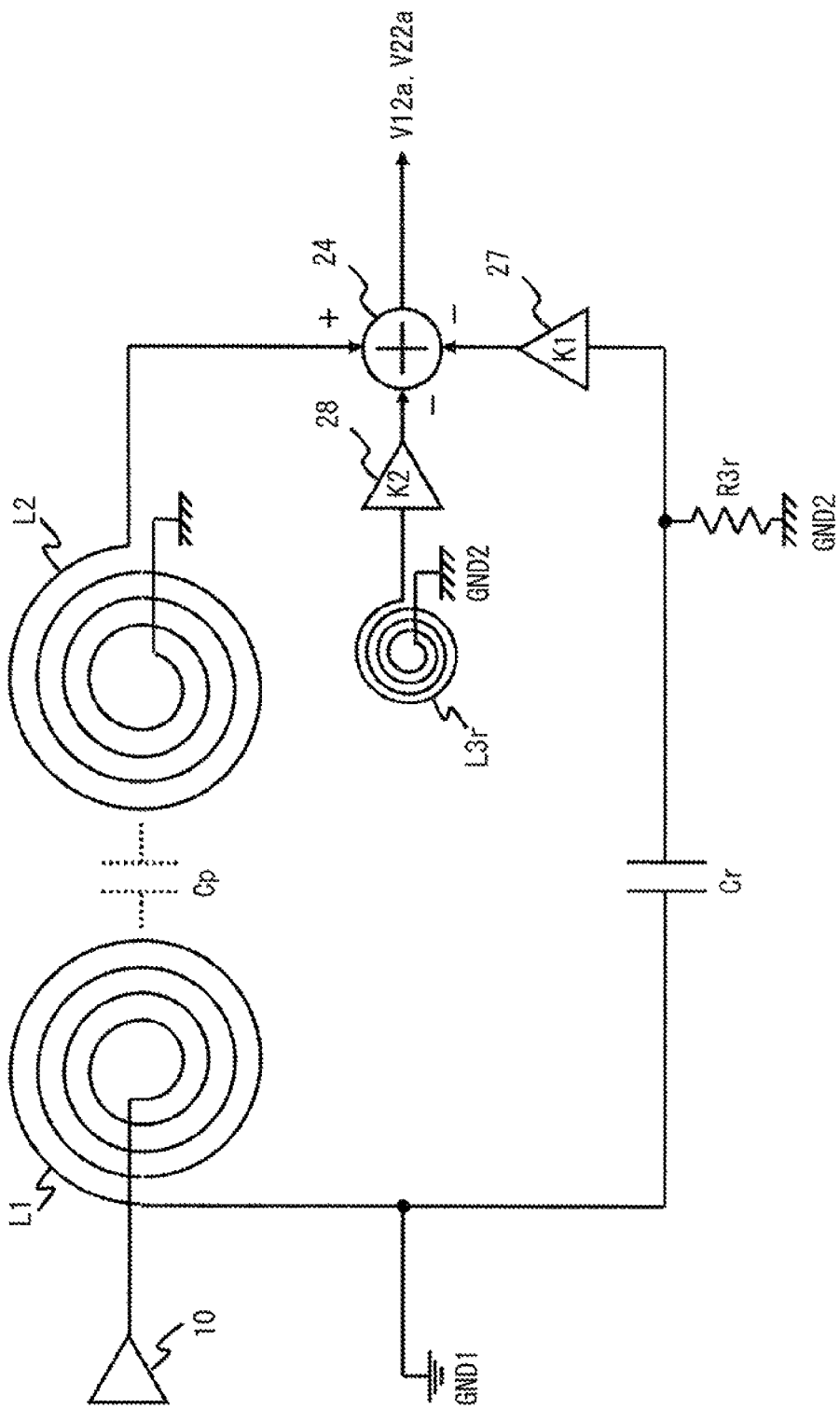
FIG. 32 is a conceptual diagram showing mounting of the signal transmission system according to the eighth exemplary embodiment.

FIG. 32 is a conceptual diagram showing mounting of the signal transmission system according to the eighth exemplary embodiment. As shown in FIG. 32, the diameter of the replica coil L3r is set to be smaller than that of the secondary coil L2 of the transformer 10. Signals from the replica capacitor Cr and the replica coil L3r are amplified by the amplifiers 28 and 29 and are input to the differential amplifier 24. The differential amplifier 24 subtracts, from the first reception signal V2 received from the secondary coil L2, the signal received from the amplifier 28 and the signal received from the amplifier 29, thereby generating the first transmission-use signal V12a and the second transmission-use signal V22a. The conceptual diagram of FIG. 32 shows the mounted state in which the primary coil L1, the secondary coil L2, and the replica coil L3r are disposed at different positions, for ease of explanation. In an actual mounted state, however, the primary coil L1, the secondary coil L2, and the replica coil L3r are arranged so that the center positions thereof are aligned.

Ninth Exemplary Embodiment

A signal transmission system according to a ninth exemplary embodiment will be described. Hereinafter, the elements described in the signal transmission systems according to the first and fourth to eighth exemplary embodiments are denoted by the same reference numerals as those used to describe the signal transmission systems according to the first and fourth to eighth exemplary embodiments, and the description thereof is omitted.

Figure 33:
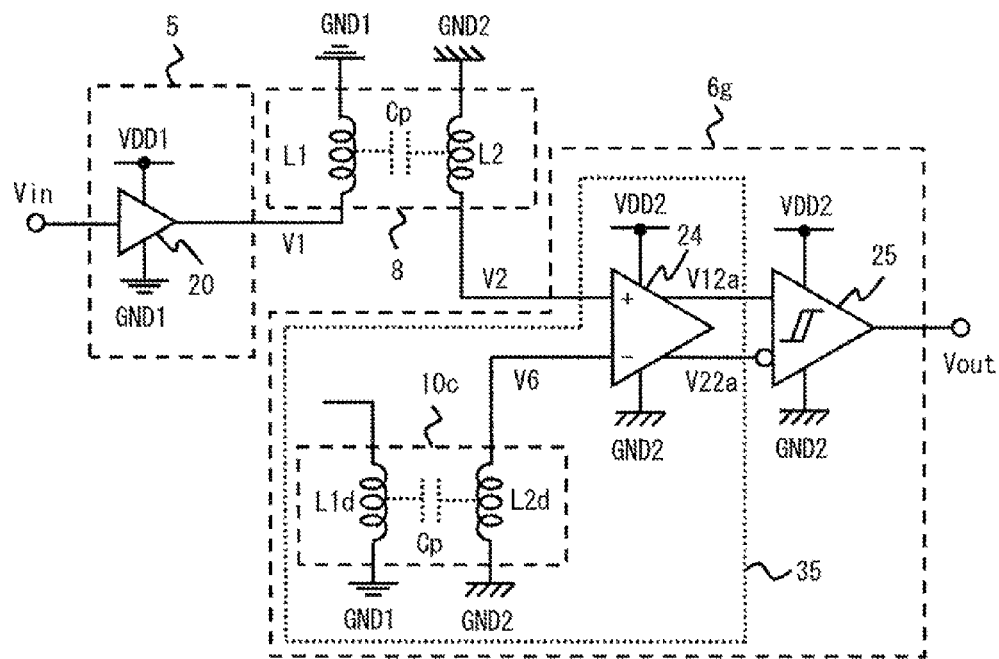
FIG. 33 is a block diagram of a signal transmission system according to a ninth exemplary embodiment.

FIG. 33 shows a block diagram of the signal transmission system according to the ninth exemplary embodiment. As shown in FIG. 33, the signal transmission system according to the ninth exemplary embodiment has a configuration in which the reception circuit 6 of the signal transmission system according to the first exemplary embodiment is replaced with a reception circuit 6g. The reception circuit 6g includes a noise rejection unit 35 and the reception buffer 25. The reception buffer 25 is identical with the reception buffer described in the fourth exemplary embodiment.

The noise rejection unit 35 has a configuration in which a dummy AC coupling element (for example, a dummy transformer 10c) is used in place of the reference noise generation unit 32a of the noise rejection unit 32 according to the sixth exemplary embodiment. The dummy transformer 10c is composed of a primary coil L1d and a secondary coil L2d. This dummy transformer 10c has the same configuration as the transformer 10. Accordingly, also in the dummy transformer 10c, the parasitic capacitor Cp exists between the primary coil L1d and the secondary coil L2d.

One terminal of the primary coil L1d of the dummy transformer 10c is connected to the ground line of the transmission circuit 5 which is supplied with the second ground voltage GND2, and the other terminal of the primary coil L1d has an open end. Note that the other terminal of the primary coil L1d may be supplied with the second ground voltage GND2, and may be connected to an element such as a buffer. One terminal of the secondary coil L2d of the dummy transformer is connected to the ground line of the reception circuit 6g which is supplied with the first ground voltage GND1, and the other terminal of the secondary coil L2d is connected to the inverting input terminal of the differential amplifier 24.

Like the transformer 10, the dummy transformer 10c includes the parasitic capacitor Cp. Like the primary coil L1 of the transformer 10, the primary coil L1d operates based on the second ground voltage GND2. Like the secondary coil of the transformer 10, the secondary coil L2d operates based on the first ground voltage GND1. Thus, at the terminal of the secondary coil L2d of the dummy transformer 10c on the side of the differential amplifier 24, a reference noise signal having the same phase and the same amplitude as those of noise between power supplies generated in the transformer 10.

The first reception signal V2 obtained through the secondary coil L2 and the reference noise signal generated in the secondary coil L2d are input to the differential amplifier 24, thereby allowing the differential amplifier 24 of the ninth exemplary embodiment to reduce the amplitude level of the noise between power supplies as in the differential amplifier 24 of the six exemplary embodiment.

Assume in the ninth exemplary embodiment that the dummy transformer 10c is formed in a region different from that in which the transformer 10 is formed. If an external magnetic variation occurs, however, the external magnetic variation affects the dummy transformer 10c and the transformer 10, which are formed close to each other, to substantially the same degree. In other words, in the ninth exemplary embodiment, the provision of the dummy transformer 10c causes noise having the same phase and the same amplitude between the dummy transformer 10c and the transformer 10, also due to external noise caused by an external magnetic variation. Accordingly, also in the ninth exemplary embodiment, the resistance to external noise can be improved as in the seventh and eighth exemplary embodiments.

Figure 34:
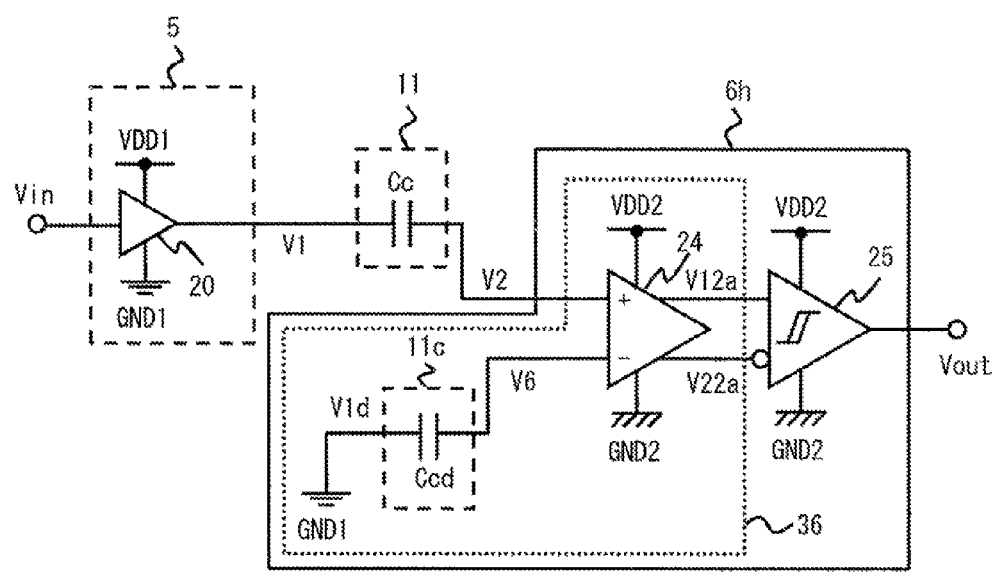
FIG. 34 is a block diagram showing a modified example of the signal transmission system according to the ninth exemplary embodiment.

Note that the configuration of the signal transmission system according to the ninth exemplary embodiment can also be applied to a modified example in which the transformers are replaced with capacitors. FIG. 34 shows a block diagram of a signal transmission system according to a modified example of the ninth exemplary embodiment. As shown in FIG. 34, in the signal transmission system according to the modified example of the ninth exemplary embodiment, a reception circuit 6h includes a noise rejection unit 36 corresponding to the noise rejection unit 35 of the reception circuit 6f. The noise rejection unit 36 includes a dummy capacitor Ccd, which has the same shape as the capacitor Cc, as a dummy AC coupling element 11c. Also this modified example, noise between power supplies having the same phase and the same amplitude is applied to each of the non-inverting input terminal and the inverting input terminal of the differential amplifier 24, thereby reducing the amplitude level of the noise between power supplies at the output of the differential amplifier 24.

Tenth Exemplary Embodiment

A signal transmission system according to a tenth exemplary embodiment will be described. Hereinafter, the elements described in the signal transmission systems according to the first and fourth to ninth exemplary embodiments are denoted by the same reference numerals as those used to describe the signal transmission systems according to the first and fourth to ninth exemplary embodiments, and the description thereof is omitted.

Figure 35:
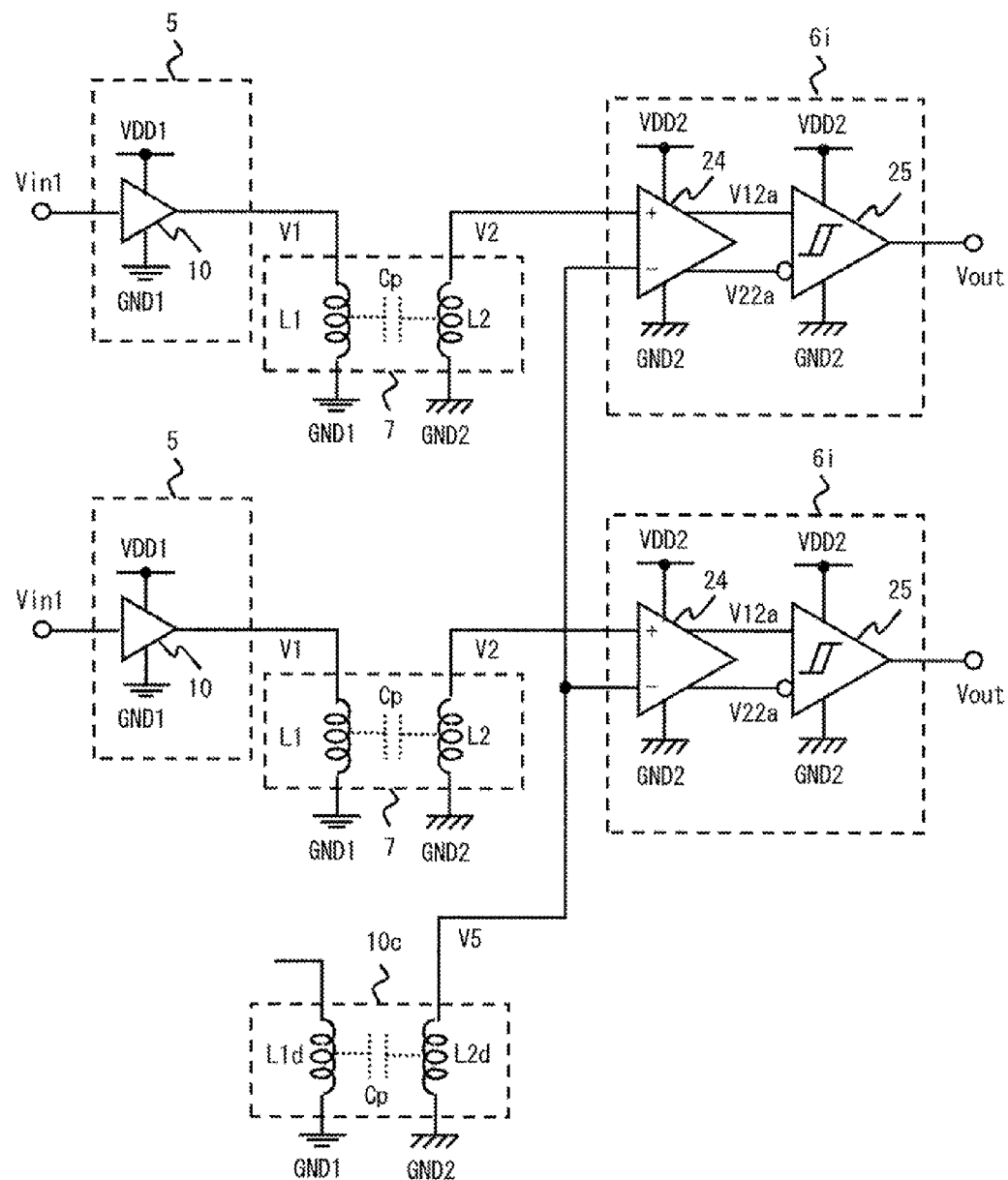
FIG. 35 is a block diagram of a signal transmission system according to a tenth exemplary embodiment.

FIG. 35 shows a block diagram of the signal transmission system according to the tenth exemplary embodiment. As shown in FIG. 35, in the signal transmission system according to the tenth exemplary embodiment, a single dummy transformer 10c is provided to a plurality of combinations of the transmission circuit 5 and a reception circuit 6i. Each reception circuit 6i includes the differential amplifier 24. The non-inverting input terminal of the differential amplifier 24 receives the first reception signal V2 generated in the corresponding secondary coil L2, and the inverting input terminal of the differential amplifier 24 receives a reference noise signal generated in the dummy transformer 10c.

In summary, in the signal transmission system according to the tenth exemplary embodiment, the dummy transformer 10c described in the ninth exemplary embodiment is shared by a plurality of combinations of the transmission circuits 5 and the reception circuit 6i, thereby improving the reliability of signal transmission as in the ninth exemplary embodiment.

Eleventh Exemplary Embodiment

A signal transmission system according to an eleventh exemplary embodiment will be described. Hereinafter, the elements described in the signal transmission systems according to the first and fourth to ninth exemplary embodiments are denoted by the same reference numerals as those used to describe the signal transmission systems according to the first and fourth to ninth exemplary embodiments, and the description thereof is omitted.

Figure 36:
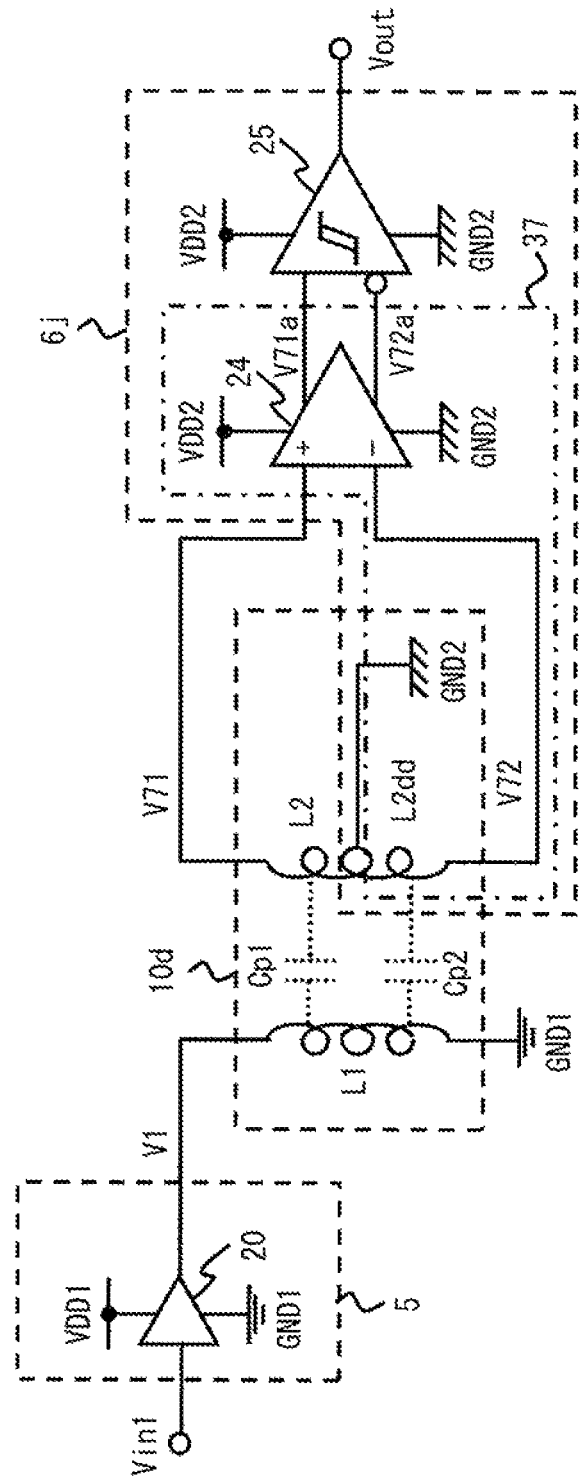
FIG. 36 is a block diagram of a signal transmission system according to an eleventh exemplary embodiment.

FIG. 36 shows a block diagram of the signal transmission system according to the eleventh exemplary embodiment. As shown in FIG. 36, in the signal transmission system according to the eleventh exemplary embodiment, the mode of a transformer for connecting the transmission circuit 5 and a reception circuit 6j is different from that of the other exemplary embodiments. A transformer 10d according to the eleventh exemplary embodiment has a configuration in which a transformer used as an AC coupling element for signal transmission and a transformer for generating a reference noise signal are integrally formed.

The transformer 10d includes the primary coil L1, the secondary coil L2, and a dummy secondary coil L2dd. In the transformer 10d, the secondary coil L2 and the dummy secondary coil L2dd are integrally formed. The first ground voltage GND1 is supplied to a node between the secondary coil L2 and the dummy secondary coil L2dd. Meanwhile, the primary coil L1 is formed so as to correspond to both the secondary coil L2 and the dummy secondary coil L2dd. In this case, a capacitance value of a parasitic capacitor Cp1, which is formed between the primary coil L1 and the secondary coil L2, and a capacitance value of a parasitic capacitor Cp2, which is formed between the primary coil L1 and the dummy secondary coil L2dd, are preferably set to be substantially equal to each other so that noise between power supplies generated between the primary coil L1 and the secondary coil L2 is equal to noise between power supplies generated between the primary coil and the dummy secondary coil L2dd.

Subsequently, a connection between the transformer 10d and the transmission circuit 5 will be described. One terminal of the primary coil L1 of the transformer 10d is connected to the ground line of the transmission circuit 5 which is supplied with the second ground voltage GND2, and the other terminal of the primary coil L1 is connected to the output of the transmission buffer 20.

Next, a connection between the transformer 10d and the reception circuit 6j will be described. The reception circuit 6j of the signal transmission system according to the eleventh exemplary embodiment includes the differential amplifier 24 and the reception buffer 25 which are described in the above exemplary embodiments. One terminal of the secondary coil L2 of the transformer 10d is connected to the non-inverting input terminal of the differential amplifier 24. One terminal of the dummy secondary coil L2dd is connected to the inverting input terminal of the differential amplifier 24. The other terminal of the secondary coil L2 of the transformer 10d and the other terminal of the dummy secondary coil L2dd are connected in common and supplied with the first ground voltage GND1. In the transformer 10d, a first reception signal V71 is generated at one terminal of the secondary coil L2, and a second reception signal V72 is generated at the other terminal of the dummy secondary coil L2dd. The first reception signal V71 and the second reception signal V72 are signals in which the amplitudes of pulse signals superimposed thereon are inverted. The differential amplifier 24 generates a first transmission-use signal V71a and a second transmission-use signal V72a based on a potential difference between the first reception signal. V71 and the second reception signal V72.

In the signal transmission system according to the eleventh exemplary embodiment, the dummy secondary coil L2dd and the differential amplifier 24 constitute a noise rejection unit 37. The noise rejection unit 37 and the reception buffer 25 constitute the reception circuit 6j. In this case, the dummy secondary coil L2dd operates as a reference noise generation unit.

Figure 37:
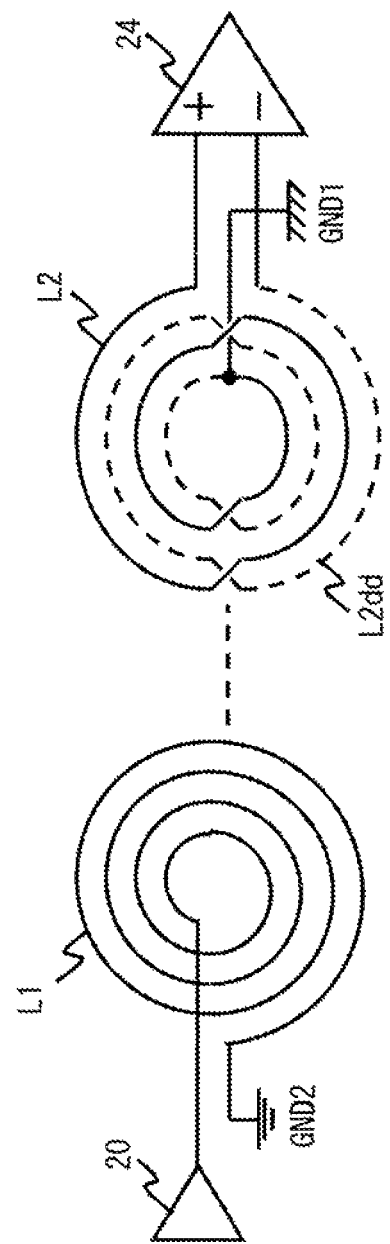
FIG. 37 is a conceptual diagram showing mounting of the signal transmission system according to the eleventh exemplary embodiment.

FIG. 37 is a conceptual diagram showing mounting of the transformer 10d. As shown in FIG. 37, the output of the transmission buffer 20 or the second ground voltage GND2 is applied to both ends of the coil. Meanwhile, the secondary coil L2 and the dummy secondary coil L2dd are formed of a single coil, and the first ground voltage GND1 is supplied to the node between the secondary coil L2 and the dummy secondary coil L2dd. Note that in FIG. 37, the center position of the primary coil is different from the center position of each of the secondary coil L2 and the dummy secondary coil L2dd. In an actual mounted state, however, the center positions of the three coils are set to be aligned with each other.

Figure 38:
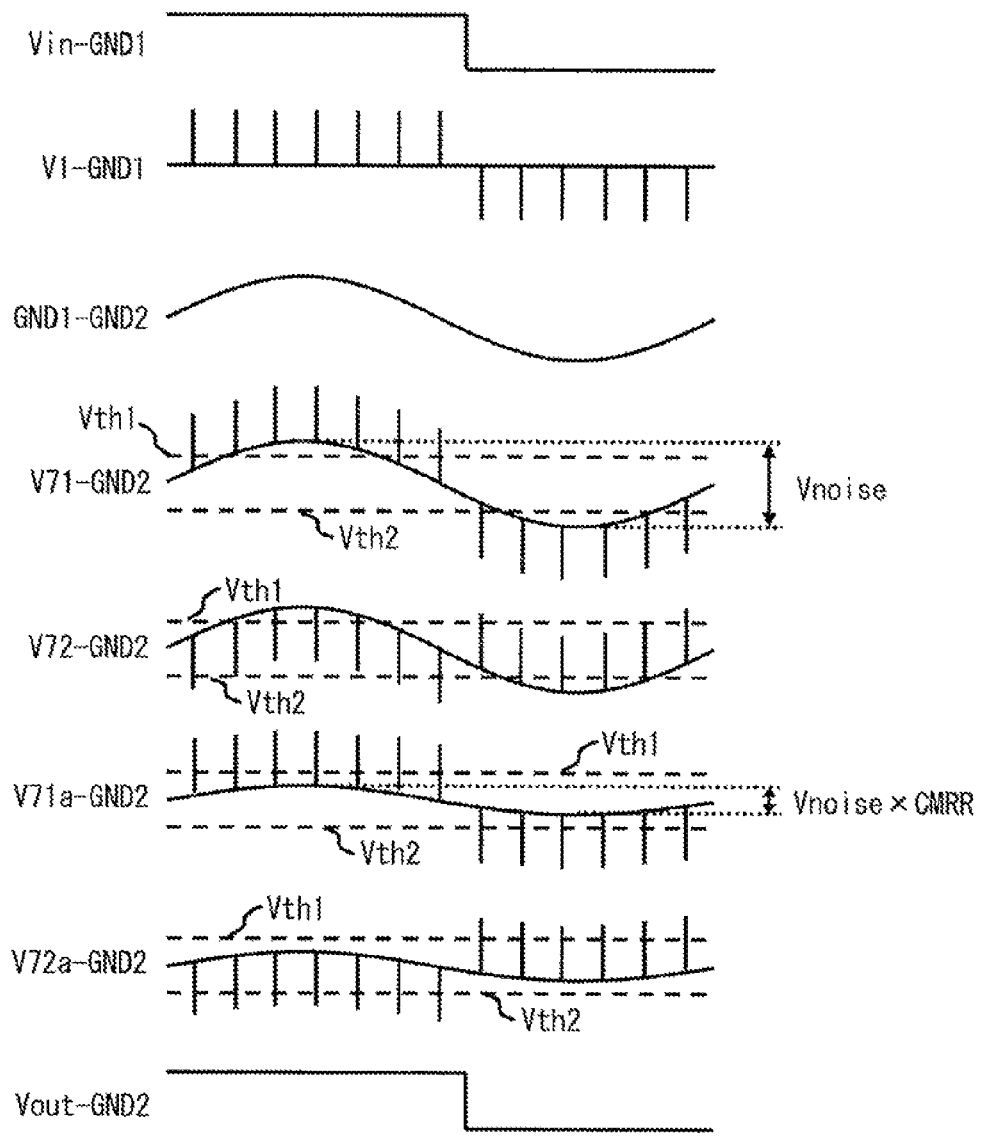
FIG. 38 is a timing diagram showing operation of the signal transmission system according to the eleventh exemplary embodiment.

Subsequently, operation of the signal transmission system according to the eleventh exemplary embodiment will be described. FIG. 38 is a timing diagram showing the operation of the signal transmission system according to the eleventh exemplary embodiment. As shown in FIG. 38, in the signal transmission system according to the eleventh exemplary embodiment, the input data Vin is a signal switching from the high level to the low level. The transmission buffer 20 generates the first transmission signal V1 based on the input data Vin. A pulse signal fluctuating in the positive direction with respect to the amplitude center potential is superimposed on the first transmission signal V1 during the period in which the input data Vin is at the high level, and a pulse signal fluctuating in the negative direction with respect to the amplitude center potential is superimposed on the first transmission signal V1 during the period in which the input data Vin is at the low level. At this time, the amplitude center potential of each of the input data Vin and the first transmission signal V1 does not vary with respect to the second ground voltage GND2.

Meanwhile, in the example shown in FIG. 38, a relative potential variation indicated by GND1-GND2 is generated between the first ground voltage GND1 and the second ground voltage GND2. The noise Vnoise between power supplies, which is generated based on this relative potential variation, is superimposed on each of the first reception signal V71 and the second reception signal V72. Accordingly, the amplitude center potential of each of the first reception signal V71 and the second reception signal V72 varies depending on the noise Vnoise between power supplies with respect to the first ground voltage GND1. The magnitude of the noise Vnoise between power supplies is greater than the potential difference between the upper threshold voltage Vth1 and the lower threshold voltage Vth2 of the reception buffer 25.

In the signal transmission system according to the eleventh exemplary embodiment, the differential amplifier 24 generates the first transmission-use signal V71a and the second transmission-use signal V72a based on the first reception signal V71 and the second reception signal V72, respectively. Herein, the noise Vnoise between power supplies, which is superimposed on each of the first reception signal V71 and the second reception signal V72, has the same phase and the same amplitude level. This is because the parasitic capacitor Cp1 between the primary coil L1 and the secondary coil L2 and the parasitic capacitor Cp2 between the primary coil L1 and the dummy secondary coil L2dd have the same capacitance value. Accordingly, the differential amplifier 24 attenuates the signal level of the noise Vnoise between power supplies based on the common-mode rejection ratio CMRR. The magnitude of the noise between power supplies after the attenuation is expressed as Vnoise×CMRR.

Thus, the first reception signal V71 and the second reception signal V72 pass through the differential amplifier 24, thereby allowing the amplitude of the noise between power supplies of each of the first transmission-use signal V71a and the second transmission-use signal V72a to be smaller than the potential difference between the upper threshold voltage Vth1 and the lower threshold voltage Vth2 of the reception buffer 25. Consequently, the reception buffer 25 can obtain the output data Vout in which the input data Vin is reproduced based on the pulse signals transmitted by the first transmission-use signal V71a and the second transmission-use signal V72a, without being affected by the noise Vnoise between power supplies.

As described above, in the signal transmission system according to the eleventh exemplary embodiment, the capacitance values of the parasitic capacitors Cp1 and Cp2, which are formed in the transformer 10d, are set to be substantially equal to each other, thereby generating the noise between power supplies having the same phase and the same amplitude in each of the first reception signal V71 and the second reception signal V72. Furthermore, the first reception signal V71 and the second reception signal V72 are input to the differential amplifier 24, thereby obtaining the effect of attenuating the signal level of the noise between power supplies based on the common-mode rejection ratio.

Moreover, in the signal transmission system according to the eleventh exemplary embodiment, the center positions of the secondary coil L2, the dummy secondary coil L2dd, and the primary coil L1 are aligned with each other, so that external noise due to an external magnetic variation occurs equally in the secondary coil L2 and the dummy secondary coil L2dd. Therefore, also in the eleventh exemplary embodiment, the resistance to external noise can be improved.

Figure 39:
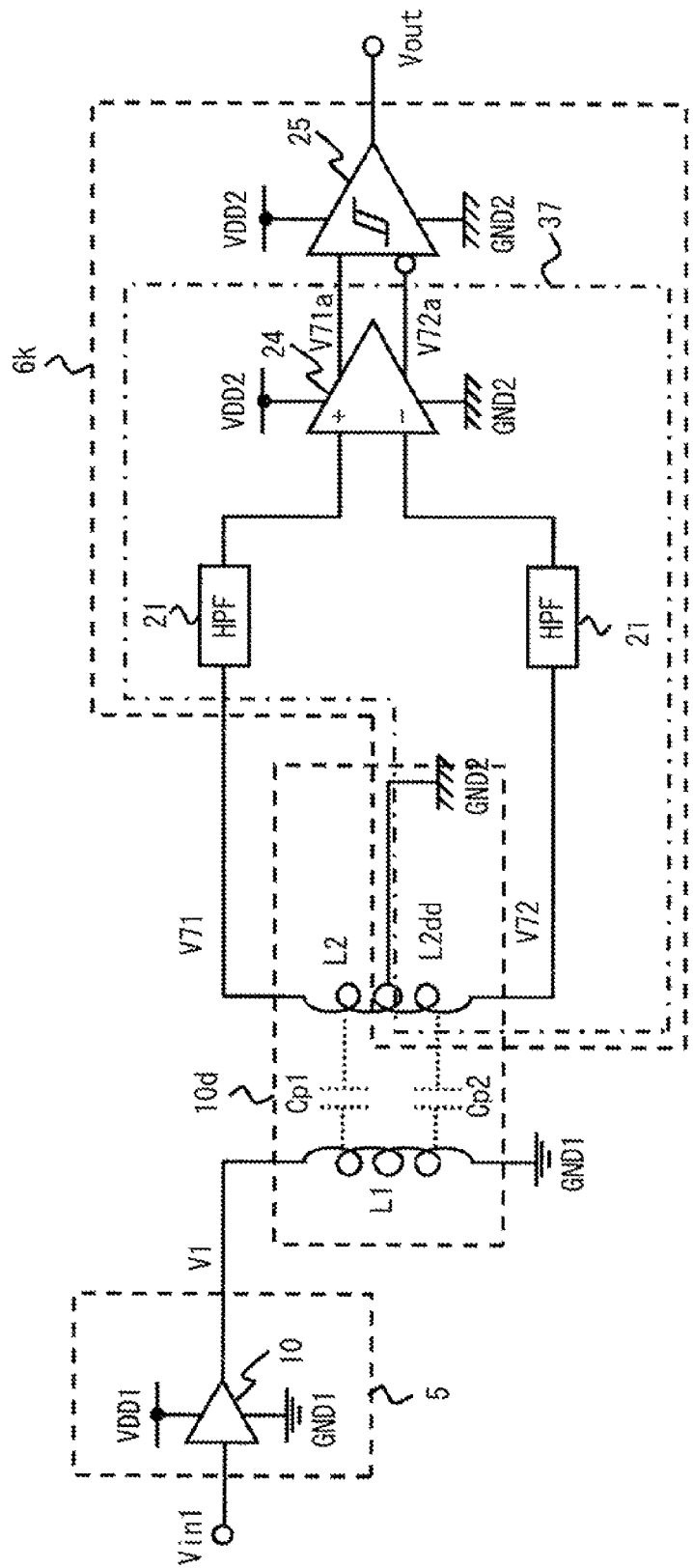
FIG. 39 is a block diagram showing a modified example of the signal transmission system according to the eleventh exemplary embodiment.
Figure 40:
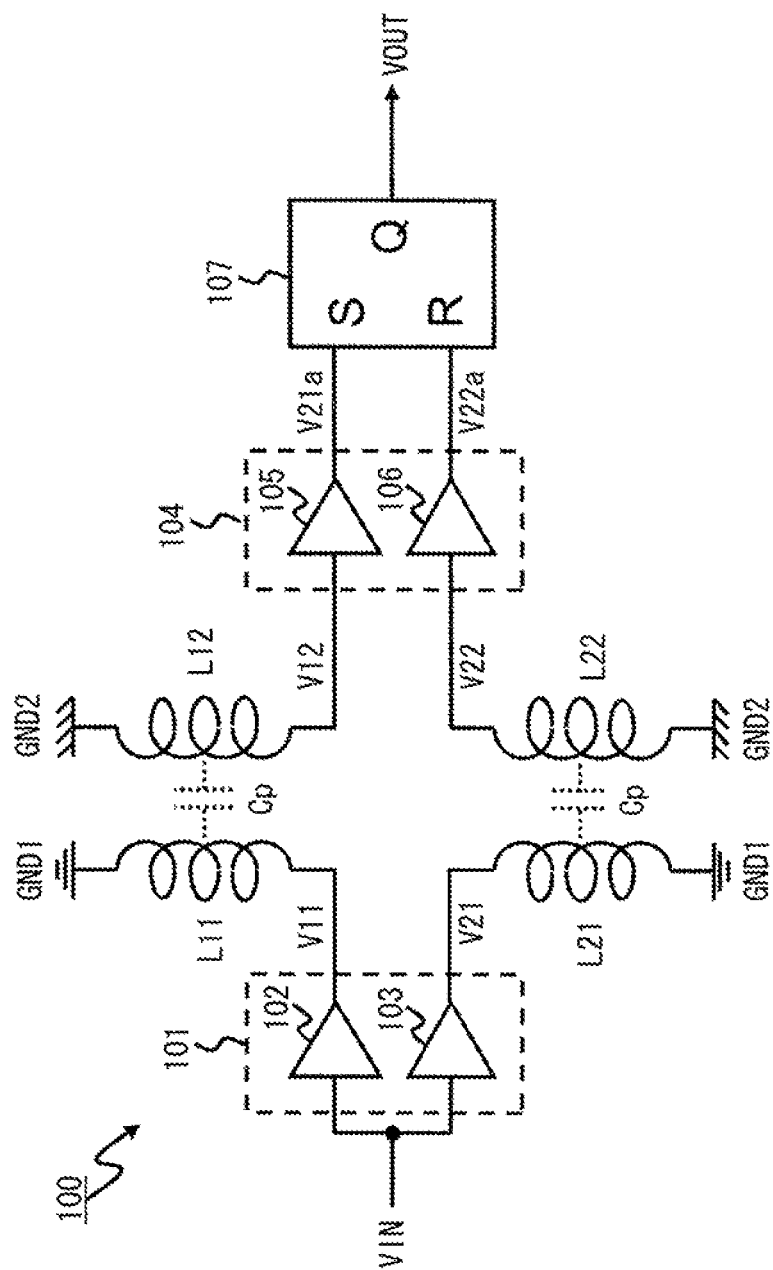
FIG. 40 is a block diagram showing a signal transmission system for explaining a problem.
Figure 41:
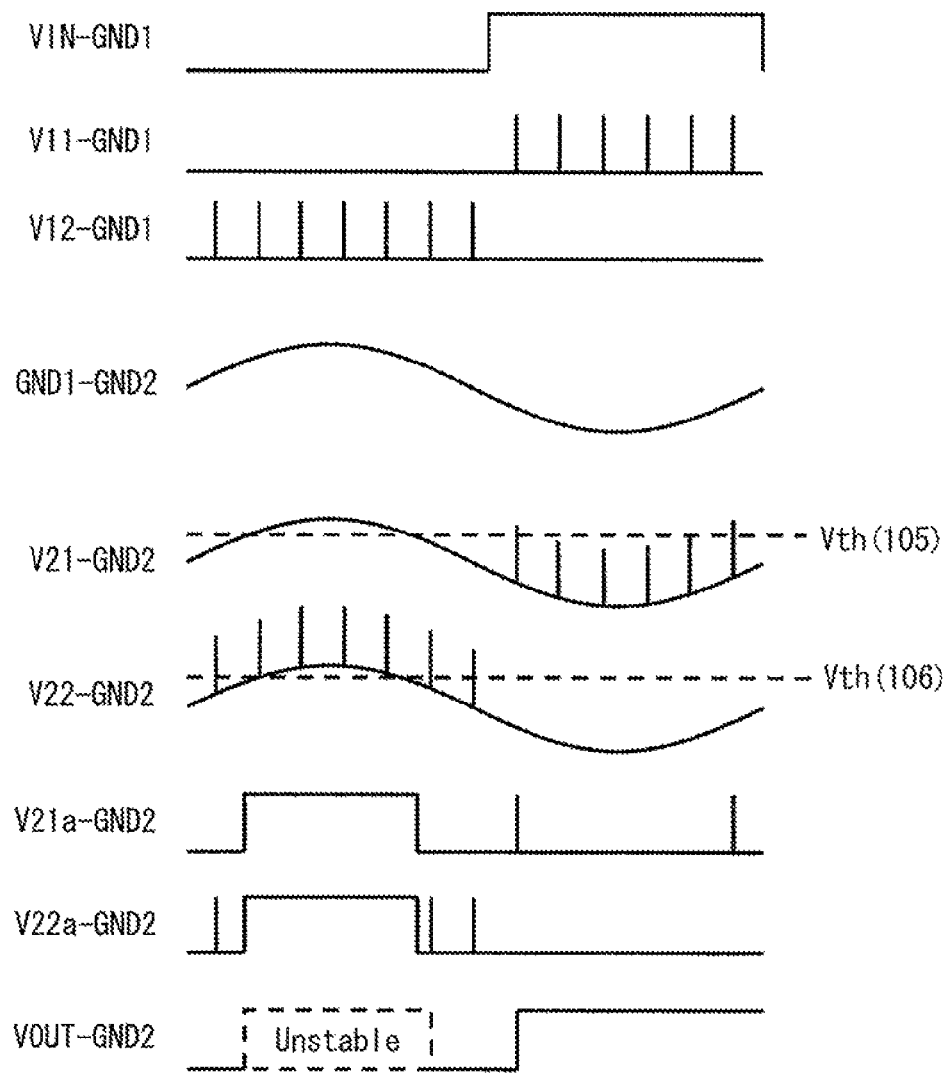
FIG. 41 is a timing diagram for explaining a problem caused in the signal transmission system shown in FIG. 40.

Note that the low-pass rejection filters 21 may be added to the signal transmission system according to the eleventh exemplary embodiment. FIG. 39 is a block diagram showing a modified example of the signal transmission system according to the eleventh exemplary embodiment to which the low-pass rejection filter 21 is added. As shown in FIG. 39, the low-pass rejection filters are disposed between the secondary coil L2 and the non-inverting input terminal of the differential amplifier 24 and between the dummy secondary coil L2dd and the inverting input terminal of the differential amplifier 24. Thus, the addition of the low-pass rejection filters 21 makes it possible to reduce the amplitude of the noise between power supplies which is input to the differential amplifier 24.

Note that the present invention is not limited to the above exemplary embodiments, but can be modified as appropriate without departing from the scope of the present invention. For example, while the above exemplary embodiments have exemplified the relative potential difference on the ground voltage side, the noise between power supplies can be reduced not only with respect to the relative potential difference on the ground voltage side, but also with respect to the relative potential difference on the power supply voltage side. Also in exemplary embodiments other than the third exemplary embodiment, the power transistor Q1 may be connected to the output of the reception buffer. In this case, the voltage described above as the first ground voltage may be replaced with the reference voltage VE.

This application is based upon and claims the benefit of priority from Japanese patent application No. 2009-038070, filed on Feb. 20, 2009, the disclosure of which is incorporated herein in its entirety by reference.

INDUSTRIAL APPLICABILITY

The present invention is applicable to a system in which signals are transmitted and received between a circuit that operates in a first power supply system and a circuit that operates in a second power supply system to which a power supply voltage different from that of the first power supply system is set.

REFERENCE SIGNS LIST

1 SEMICONDUCTOR PACKAGE
2 LEAD TERMINAL
3, 4, 7 SEMICONDUCTOR CHIP
5, 5a, 5b TRANSMISSION CIRCUIT
6, 6a-6j RECEPTION CIRCUIT
8 SEMICONDUCTOR SUBSTRATE
10, 10a-10d TRANSFORMER
11, 11a-11c CAPACITOR
20, 23a, 23b TRANSMISSION BUFFER
21 LOW-PASS REJECTION FILTER
22, 25 RECEPTION BUFFER
24, 26 DIFFERENTIAL AMPLIFIER
27-29 AMPLIFIER
31, 32-37 NOISE REJECTION UNIT
32a-34a REFERENCE NOISE GENERATION UNIT
Cc, Cca, Ccb, Ccd, Ch CAPACITOR
Cr REPLICA CAPACITOR
Cp, Cp1, Cp2 PARASITIC CAPACITOR
Ce1, Ce1a, Ce1b ELECTRODE
Ce2, Ce2a, Ce2b ELECTRODE
CLK CLOCK SIGNAL
L1, L11, L1d, L21 PRIMARY COIL
L2, L12, L2d, L22 SECONDARY COIL
L3r REPLICA COIL
N1-N3 NMOS TRANSISTOR
Pd PAD
Q1 POWER TRANSISTOR
R1h, R2h, R3r RESISTOR
RL1, RL2 LOAD RESISTOR
W BONDING WIRE

The invention claimed is:

1. A reception circuit that operates based on a first power supply belonging to a first power supply system and receives, through an AC coupling element, a transmission signal output by a transmission circuit that operates based on a second power supply belonging to a second power supply system, the reception circuit comprising:
a noise rejection unit that generates a transmission-use signal by reducing a signal level of noise between the power supplies, the noise being generated in the AC coupling element due to a potential difference between the first power supply and the second power supply; and
a reception buffer that reproduces a data signal based on the transmission-use signal.

2. The reception circuit according to claim 1, wherein the noise rejection unit includes a low-pass rejection filter that is provided between the AC coupling element and the reception buffer and generates the transmission-use signal by reducing the noise between the power supplies, the noise being included in the reception signal.

3. The reception circuit according to claim 1,
wherein the noise rejection unit includes:
a reference noise generation unit that generates a reference noise signal having the same phase as the noise between the power supplies; and
a differential amplifier that amplifies a potential difference between the reception signal and the reference noise signal to generate the transmission-use signal.

4. The reception circuit according to claim 3, wherein
the AC coupling element serves as a transformer including a primary coil and a secondary coil, the primary coil and the secondary coil being formed on one or two semiconductor substrates, and
the reference noise generation unit includes a replica capacitor having a capacitance value corresponding to a capacitance value of a parasitic capacitor formed between the primary coil and the secondary coil, one terminal of the replica capacitor being connected to the second power supply.

5. The reception circuit according to claim 4, wherein the reference noise generation unit includes a first preceding-stage amplifier that is provided between the replica capacitor and the differential amplifier and adjusts a signal level of a signal obtained from the replica capacitor.

6. The reception circuit according to claim 4, wherein the reference noise generation unit includes a replica coil connected between the other terminal of the replica capacitor and the first power supply, the replica coil having an inductance value corresponding to an inductance value of the secondary coil.

7. The reception circuit according to claim 6, wherein the reference noise generation unit includes a second preceding-stage amplifier that is provided between the replica coil and the differential amplifier and adjusts a signal level of a signal obtained from the replica coil.

8. The reception circuit according to claim 7, wherein the first preceding-stage amplifier and the second preceding-stage amplifier are configured as a single amplifier, and the amplifier combines a signal obtained from the replica capacitor with a signal obtained from the replica coil and outputs a combined signal to the differential amplifier.

9. The reception circuit according to claim 6, wherein the replica coil has a diameter smaller than that of the secondary coil.

10. The reception circuit according to claim 3, wherein the reference noise generation unit includes a dummy AC coupling element that is identical with the AC coupling element, the dummy AC coupling element having at least one transmission circuit side terminal connected to the second power supply, and a reception circuit side terminal for supplying the reference noise signal to the differential amplifier.

11. The reception circuit according to claim 10, wherein
the AC coupling element and the dummy AC coupling element are transformers including a primary coil and a secondary coil,
the primary coil of the AC coupling element has one terminal connected to the second power supply, and the other terminal connected to the transmission circuit,
the secondary coil of the AC coupling element has one terminal connected to the first power supply, and the other terminal connected to the differential amplifier,
the primary coil of the dummy AC coupling element has one terminal connected to the second power supply, and
the secondary coil of the dummy AC coupling element has one terminal connected to the first power supply, and the other terminal connected to the differential amplifier.

12. The reception circuit according to claim 10, wherein
the AC coupling element and the dummy AC coupling element are capacitors including a first electrode and a second electrode, the first electrode and the second electrode being formed on a semiconductor substrate,
the first electrode of the AC coupling element is connected to the transmission circuit,
the second electrode of the AC coupling element is connected to the differential amplifier, the first electrode of the dummy AC coupling element is connected to the first power supply, and
the second electrode of the dummy AC coupling element is connected to the differential amplifier.

13. The reception circuit according to claims 10, wherein a single dummy AC coupling element is provided to a plurality of the AC coupling elements.

14. The reception circuit according to claim 3, wherein
the AC coupling element serves as a transformer including a primary coil and a secondary coil,
the primary coil of the AC coupling element has one terminal connected to the second power supply, and the other terminal connected to the transmission circuit,
the secondary coil of the AC coupling element has one terminal connected to the first power supply, and the other terminal connected to the differential amplifier,
the reference noise generation unit includes a dummy secondary coil formed to be continuous with the secondary coil of the AC coupling element, the dummy secondary coil having one terminal connected to the first power supply, and the other terminal connected to the differential amplifier, and
a capacitance value of a parasitic capacitor formed between the primary coil and the secondary coil is substantially equal to a capacitance value of a parasitic capacitor formed between the primary coil and the dummy secondary coil.

15. The reception circuit according to claim 14, comprising low-pass rejection filters provided between the secondary coil of the AC coupling element and the differential amplifier and between the dummy secondary coil and the differential amplifier.

16. The reception circuit according to claim 1, wherein the AC coupling element includes:
a first AC coupling element that transmits a first transmission signal to the reception circuit, the first transmission signal being output by the transmission circuit; and
a second AC coupling element that transmits a second transmission signal to the reception circuit, the second transmission signal being output by the transmission circuit and having a complementary relation with the first transmission signal, and
the noise rejection unit includes a differential amplifier that amplifies and outputs a difference voltage between a first reception signal obtained through the first AC coupling element and a second reception signal obtained through the second AC coupling element.

17. The reception circuit according to claim 16, comprising:
a first low-pass rejection filter provided between the differential amplifier and the first AC coupling element; and
a second low-pass rejection filter provided between the differential amplifier and the second AC coupling element.

18. The reception circuit according to claim 16, wherein the first and second AC coupling elements are transformers respectively including a primary coil and a secondary coil.

19. The reception circuit according to claim 16, wherein each of the first and second AC coupling elements serves as a capacitor.

20. The reception circuit according to claim 16, wherein
the first transmission signal has a pulse-like signal waveform when data to be transmitted has a first logic level, and
the second transmission signal has a pulse-like signal waveform when the data to be transmitted has a second logic level.

21. The reception circuit according to claim 16, wherein the first transmission signal and the second transmission signal are differential signals.

22. The reception circuit according to claim 2,
wherein the low-pass rejection filter includes:
first and second resistors connected in series between a high-potential-side power supply line for supplying a voltage on a high potential side of the first power supply, and a low-potential-side power supply line for supplying a voltage on a low potential side of the first power supply; and
a capacitor having one terminal receiving the reception signal, and the other terminal connected to a node between the first and second resistors and to the reception buffer.

23. The reception circuit according to claim 2, wherein
the reception circuit includes a power transistor, a conduction state of the power transistor being controlled based on the data signal reproduced by the reception buffer, and
the reception circuit operates with an output voltage of the power transistor as the first power supply.

24. A signal reception method for a reception circuit that operates based on a first power supply belonging to a first power supply system and receives, through an AC coupling element, a transmission signal output by a transmission circuit that operates based on a second power supply belonging to a second power supply system, the signal reception method comprising:
generating a transmission-use signal by reducing a signal level of noise between the power supplies, the noise being generated in the AC coupling element due to a potential difference between the first power supply and the second power supply; and
reproducing a data signal based on the transmission-use signal.

25. The signal reception method according to claim 24, wherein the noise between the power supplies has a frequency lower than that of a pulse signal superimposed on the transmission-use signal.

26. The signal reception method according to claim 24, wherein the transmission-use signal is generated based on a potential difference between a reference noise signal and the noise between the power supplies, the reference noise signal having the same phase as the noise between the power supplies.

27. The signal reception method according to claim 26, wherein the reference noise signal having an amplitude amplified with a predetermined amplification factor is used to generate the transmission-use signal.

28. The signal reception method according to claim 24, wherein a reference external noise signal corresponding to external noise externally input to the AC coupling element is generated, and the transmission-use signal is generated based on a potential difference between the noise between the power supplies and the reference external noise signal.

29. The signal reception method according to claim 24, wherein
the AC coupling element includes:
a first AC coupling element that transmits a first transmission signal to the reception circuit, the first transmission signal being output by the transmission circuit; and a second AC coupling element that transmits a second transmission signal to the reception circuit, the second transmission signal being output by the transmission circuit and having a complementary relation with the first transmission signal, and
the transmission-use signal is generated based on a difference voltage between a first reception signal obtained through the first AC coupling element and a second reception signal obtained through the second AC coupling element.

* * * * *